(12) United States Patent
Ballantine et al.

(10) Patent No.: US 7,045,372 B2
(45) Date of Patent: May 16, 2006

(54) APPARATUS AND METHOD FOR FORMING A BATTERY IN AN INTEGRATED CIRCUIT

(75) Inventors: Arne W. Ballantine, Round Lake, NY (US); Robert A. Groves, Highland, NY (US); Jennifer L. Lund, Amawalk, NY (US); James S. Nakos, Essex, VT (US); Michael B. Rice, Colchester, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/632,652

(22) Filed: Aug. 2, 2003

(65) Prior Publication Data

US 2004/0021201 A1    Feb. 5, 2004

Related U.S. Application Data

(62) Division of application No. 09/761,123, filed on Jan. 16, 2001, now Pat. No. 6,650,000.

(51) Int. Cl.
*H01L 21/00* (2006.01)

(52) U.S. Cl. .................. 438/19; 438/618; 438/624
(58) Field of Classification Search ........ 438/618–680, 438/19
See application file for complete search history.

(56) References Cited

U.S. PATENT DOCUMENTS 4,789,648 A    12/1988  Chow et al.
4,878,094 A    10/1989  Balkanski (Continued)

FOREIGN PATENT DOCUMENTS

JP    2000188113 A    7/2000

OTHER PUBLICATIONS

Lee et al., "All-Solid-State Rocking Chair Lithium Battery on a Flexible Al Substrate,"; Electrochemical and Solid State Letters V2 N9 Sep. 1999 p. 425-427.

(Continued)

*Primary Examiner*—H. Jey Tsai
(74) *Attorney, Agent, or Firm*—Schmeiser, Olsen & Watts; William H. Steinberg

(57) ABSTRACT

A method and structure that provides a battery within an integrated circuit for providing voltage to low-current electronic devices that exist within the integrated circuit. The method includes Front-End-Of-Line (FEOL) processing for generating a layer of electronic devices on a semiconductor wafer, followed by Back-End-Of-Line (BEOL) integration for wires connecting the electronic devices together to form completed electrical circuits of the integrated circuit. The BEOL integration includes forming a multilayered structure of wiring levels on the layer of electronic devices. Each wiring level includes conductive metallization (e.g., metal-plated vias, conductive wiring lines, etc.) embedded in insulative material. The battery is formed during BEOL integration within one or more wiring levels, and the conductive metallization conductively couples positive and negative terminals of the battery to the electronic devices. The battery may have several different topologies relative to the structural and geometrical relationships among the battery electrodes and electrolyte. Multiple batteries may be formed within one or more wiring levels, and may be conductively coupled to the electronic devices. The multiple batteries may be connected in series or in parallel.

33 Claims, 17 Drawing Sheets

U.S. PATENT DOCUMENTS

| | | | |
|---|---|---|---|
| 5,308,720 A | | 5/1994 | Kurokawa et al. |
| 5,338,625 A | | 8/1994 | Bates et al. |
| 5,455,126 A | | 10/1995 | Bates et al. |
| 5,512,147 A | | 4/1996 | Bates et al. |
| 5,561,004 A | * | 10/1996 | Bates et al. ............... 429/162 |
| 5,567,210 A | | 10/1996 | Bates et al. |
| 5,705,293 A | | 1/1998 | Hobson |
| 5,759,911 A | | 6/1998 | Cronin et al. |
| 5,864,182 A | | 1/1999 | Matsuzaki |
| 5,960,254 A | | 9/1999 | Cronin |
| 5,965,459 A | | 10/1999 | Beyer |
| 5,976,928 A | | 11/1999 | Kirlin et al. |
| 6,264,709 B1 | | 7/2001 | Yoon et al. |
| 6,610,440 B1 | * | 8/2003 | LaFollette et al. ......... 429/122 |
| 6,924,164 B1 | * | 8/2005 | Jenson ....................... 438/48 |
| 2001/0000744 A1 | * | 5/2001 | Wolk et al. ................. 430/200 |

OTHER PUBLICATIONS

Park et al., "All-Solid-State Lithium Thin-Film Rechargeable Battery With Lithium Manganese Oxide,"; Electrochemical and Solid State Letters V2 N2 Feb. 1999 p. 58-59.

T.A. Kuku, "ION Transport Studies on Vacuum Deposited PbSnI4 Thin Films,"; Thin Solid Films V 340 N1 1999 p. 292-296.

Gregor, L.V., "Thin Film Voltage Source,"; IBM Technical Disclosure Bulletin, Nov. 1964, p. 433.

* cited by examiner

APPARATUS AND METHOD FOR FORMING A BATTERY IN AN INTEGRATED CIRCUIT

This application is a divisional of Ser. No. 09/761,123; filed on Jan. 16, 2001 now U.S. Pat. No. 6,650,000.

BACKGROUND OF THE INVENTION

1. Technical Field

The present invention relates to a method and structure that provides a battery within an integrated circuit for providing voltage to low-current electronic devices that exist within the integrated circuit.

2. Related Art

An integrated circuit, which may include a semiconductor chip, comprises electronic devices on a bulk silicon wafer, and metallic wiring patterns which conductively couple the electronic devices, resulting in formation of electrical circuits. "Conductive" and like words means "electrically conductive" herein, unless otherwise stated. The electronic devices include field effect transistors, bipolar transistors, diodes, etc. The metallic wiring patterns include conductive wiring lines, metal-plated vias, etc. In integrated circuits, the metallic wiring patterns are multi-layered, wherein each layer includes intra-layer metallic wiring patterns embedded within insulative material such as dielectric material. Intra-layer metallic wiring patterns of a given layer may be conductively coupled to intra-layer metallic wiring patterns in one or more other layers, as well as to the electronic devices.

The electronic devices of the integrated circuit require bias voltages and reference voltages, which are supplied by conventional or standard voltage sources. A conventional or standard voltage source includes a battery or the like which is readily commercially available. For particular integrated circuit applications requiring nonstandard bias and nonstandard reference voltages, conventional or standard voltage sources may be inadequate. A nonstandard bias or nonstandard reference voltage is any voltage not included in the voltages supplied by the standard voltage source.

There is a need for a method and structure to supply nonstandard bias voltages and nonstandard reference voltages in accordance with special requirements of particular integrated circuits.

SUMMARY OF THE INVENTION

The present invention provides an electrochemical structure within an integrated circuit, comprising:

a semiconductor wafer;

a layer of electronic devices on the semiconductor wafer, wherein the layer of electronic devices includes at least one electronic device;

N wiring levels on the layer of electronic devices, wherein N is at least 1, wherein the N wiring levels are denoted as wiring level 1, wiring level 2, . . . , wiring level N, and wherein the N wiring levels include a first conductive metallization and a second conductive metallization; and at least one battery within the wiring levels I, I+1, . . . K, wherein I is selected from the group consisting of 1, 2, . . . , and N, wherein K is selected from the group consisting of I, I+1, . . . , and N, wherein the first conductive metallization conductively couples a first electrode of the at least one battery to the at least one electronic device, and wherein the second conductive metallization conductively couples a second electrode of the battery to the at least one electronic device.

The present invention provides a method for forming an electrochemical structure within an integrated circuit, comprising:

providing a semiconductor wafer;

forming a layer of electronic devices on the semiconductor wafer, wherein the layer of electronic devices includes at least one electronic device;

forming N wiring levels on the layer of electronic devices, wherein N is at least 1, wherein the N wiring levels are denoted as wiring level 1, wiring level 2, . . . , wiring level N;

forming a first conductive metallization and a second conductive metallization within the N wiring levels; and forming at least one battery within the wiring levels I, I+1, . . . K, wherein I is selected from the group consisting of 1, 2, . . . , and N, wherein K is selected from the group consisting of I, I+1, . . . , and N, wherein the first conductive metallization conductively couples a first electrode of the at least one battery to the at least one electronic device, and wherein the second conductive representation conductively couples a second electrode of the battery to the at least one electronic device.

The present invention supplies nonstandard bias voltages and nonstandard reference voltages in accordance with special requirements of particular integrated circuits. The present invention also avoids using external voltage sources for supplying voltage to integrated circuits that require low-power input, wherein the external voltage sources require more wiring levels, have a larger size, or occupy a larger volume.

DETAILED DESCRIPTION OF THE INVENTION

An integrated circuit may be fabricated by, inter alia, Front-End-Of-Line (FEOL) processing followed by Back-End-Of-Line (BEOL) integration. FEOL processing comprises forming a layer of electronic devices on a semiconductor wafer, which includes supporting process steps for defining the electronic devices (e.g., photolithography, annealing, ion implants, oxidation, etc.). The semiconductor wafer may include, inter alia, a bulk single-crystal silicon wafer with or without a buried oxide layer. The electronic devices include, inter alia, transistors, bipolar transistors, diodes, etc. BEOL integration conductively couples the electronic devices together to form completed electrical circuits, by forming a multilayered structure on and above the layer of electronic devices. Each layer of the multilayered structure may be thought of as a wiring level that includes conductive metallization (e.g., metal-plated vias, conductive wiring lines, etc.) embedded in insulative material (e.g., a dielectric material). Thus, a layer of the multilayered structure will be referred to herein as a "wiring level." Each wiring level may be formed by, inter alia, placing a layer of dielectric material on the previously formed layer, forming trenches or vias in the dielectric material, placing metal in the trenches or vias (or on the sidewalls of the trenches or vias), and polishing (i.e., planarizing) the exposed surface of the layer. A result of the forming of wiring levels, conductive metallization within each wiring level is conductively coupled to conductive metallization within another wiring level. As a result of the BEOL integration, completed circuits of the integrated circuit are formed. Definitionally, BEOL integration begins as soon as a first portion of a first metallization has been formed on or within, or coupled to, the semiconductor wafer, even if formation of the layer of electronic devices has not been completed.

The present invention provides a method and structure for forming a battery within the integrated circuit at or on a wiring level of the aforementioned multilayered structure. The battery of the present invention is formed within one or more wiring levels during BEOL integration. Although an extra wiring level of the multilayered structure may be added to accommodate formation of the battery, it may be possible to form the battery without adding an extra wiring level in situations in which the battery is placed in a portion of a wiring level that is sparsely populated with conductive metallization. The battery may be formed directly above one or more of the electronic devices, or may be formed above one or more of the electronic devices but laterally displaced from the electronic devices.

Figure 1:
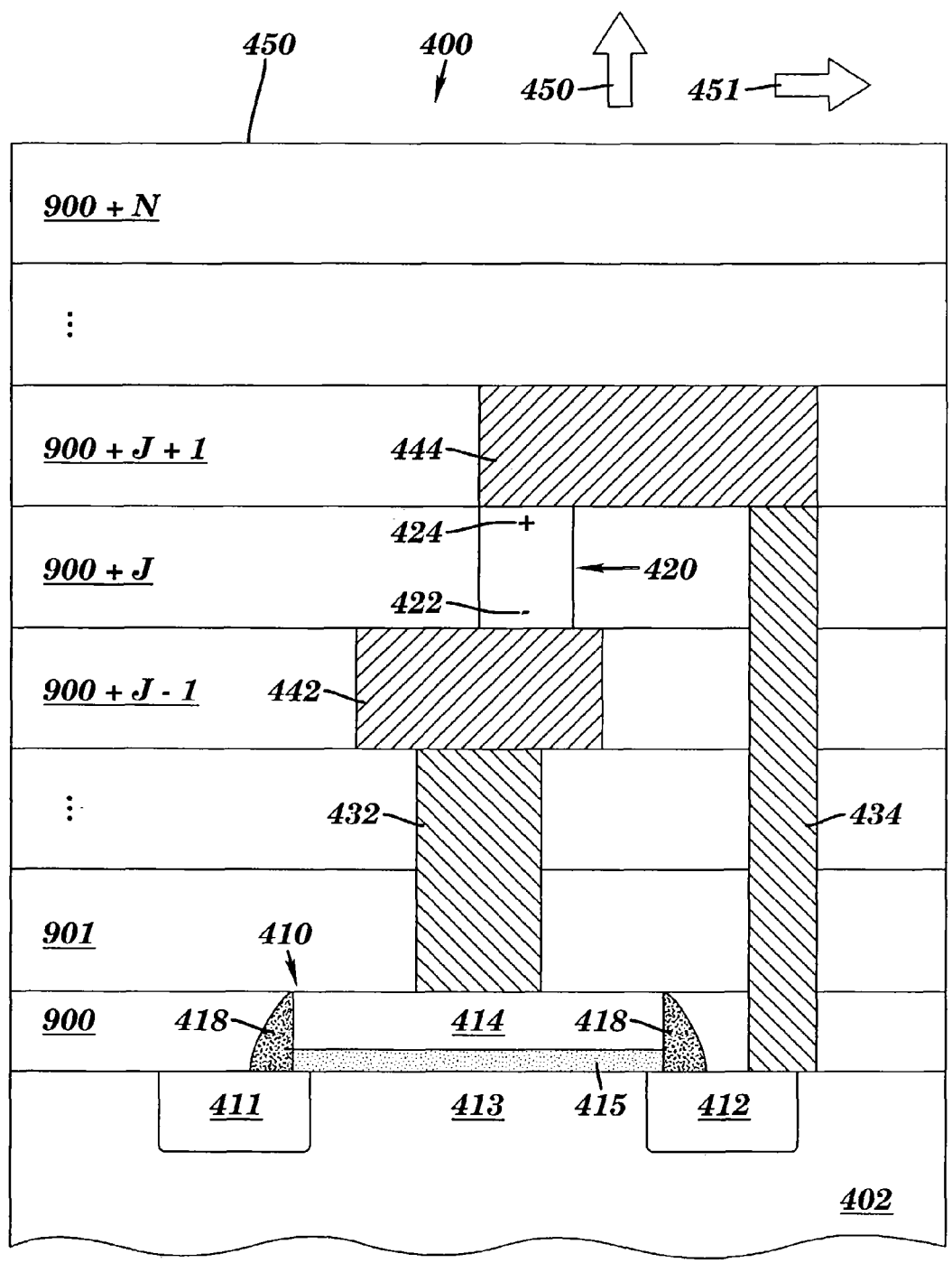
FIG. 1 depicts a front cross-sectional view of an integrated circuit that includes a battery and conductive metallization, in accordance with embodiments of the present invention.

FIG. 1 illustrates an integrated circuit 400 that includes a bulk semiconductor wafer 402, a layer 900 of electronic devices coupled to the bulk semiconductor wafer 402, N wiring levels formed on the layer 900 of electronic devices during BEOL integration, and a battery 420 formed during BEOL integration, in accordance with embodiments of the present invention. The N wiring levels are denoted as wiring levels 901, . . . , 900+J, . . . , 900+N, and the battery 420 is at the wiring level 900+J, wherein $2 \leq J \leq N$. Fabrication of the integrated circuit 400 begins with providing the bulk semiconductor wafer 402 (e.g., a bulk single-crystal silicon wafer with or without a buried oxide layer). Next, FEOL processing forms the layer 900 of electronic devices on the bulk semiconductor wafer 402 by any method known to one of ordinary skill in the art. The layer 900 of electronic devices includes a plurality of electronic devices in a background of semiconductor material (e.g., $P^-$ silicon), and may include millions of electronic devices or more. The electronic devices may include, inter alia, semiconductor devices such as field effect transistors, bipolar transistors, diodes, etc. For illustrative purposes, the layer 900 of electronic devices includes a field effect transistor (FET) 410, which comprises a source/drain 411, a source/drain 412, a channel 413, a gate 414, a gate insulator 415, and insulative spacers 418.

BEOL integration follows FEOL processing. BEOL integration forms the N wiring levels ($N \geq 1$) and includes forming conductive metallization embedded within insulative material (e.g., dielectric material). The conductive metallization includes conductive wiring, metal-plated vias, etc., which serve to conductively couple electronic devices on the layer of electronic devices 900. A conductive metallization representation 432 represents conductive metallization in the wiring levels 901, ..., 900+J−2, and may include conductive metallization of all kinds (e.g., conductive wiring lines, metal-plated vias, etc.) within each wiring level. The conductive metallization representation 434 represents conductive metallization in the wiring levels 901, ..., 900+J and may include metallization of all kinds (e.g., conductive wiring lines, metal-plated vias, etc.) within each wiring level. An electrical conductor 442 is a form of conductive metallization that represents a conductive plate, a conductive plug, or a similar conductive volume in the wiring level 900+J−1. An electrical conductor 444 is a form of conductive metallization that represents a conductive plate, a conductive plug, or a similar conductive volume in the wiring level 900+J+1. Although not shown, wiring levels 900+J+2, ..., 900+N may also include conductive metallization of all kinds (e.g., conductive wiring lines, metal-plated vias, etc.).

Using any method known to one of ordinary skill in the art, the wiring level 901 is formed on the layer of electronic devices 900, and the wiring level 900+I is formed on the wiring level 900+I−1, for I=2, 3, ..., N. Each of the N wiring levels may be formed by, inter alia, placing a layer of dielectric material on the previously formed wiring level (or on the previously formed layer of electronic devices 900 for forming the wiring level 901), forming trenches or vias in the dielectric material, placing metal (e.g., copper) in the trenches or vias (or on the sidewalls of the trenches or vias), and polishing (i.e., planarizing) the exposed surface of the wiring level being formed. The processes that form the wiring levels conductively couple each wiring level: to another wiring level, to one or more electronic devices formed during the FEOL processing, and/or to one or more electronic structures or electrical devices external to the integrated circuit 400. In that manner, completed circuits of the integrated circuit 400 are formed.

Figure 11:
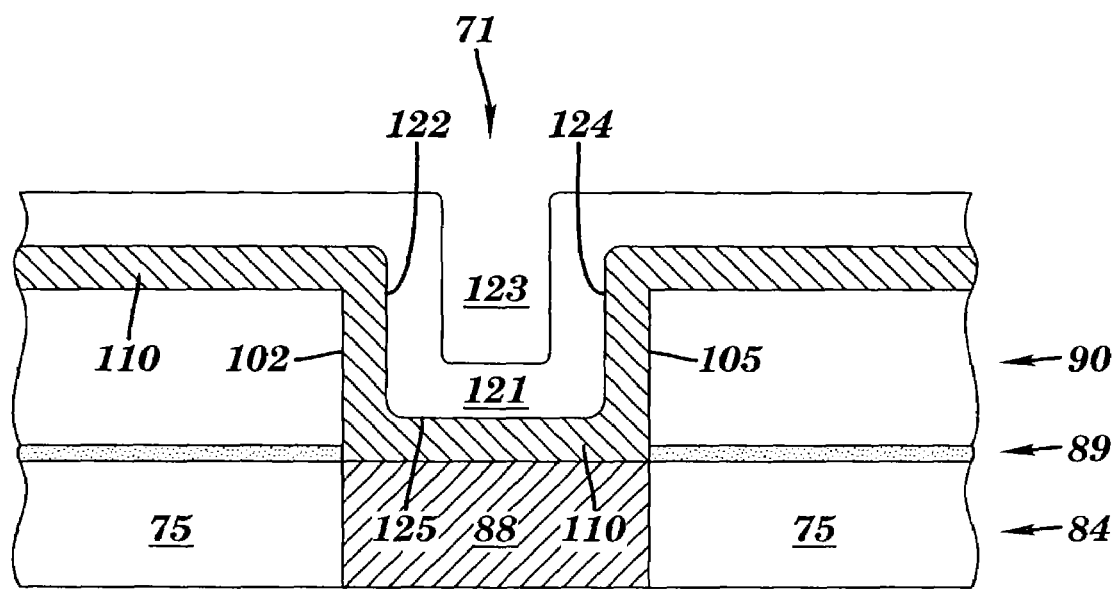
FIG. 11 depicts FIG. 10 after an electrolyte layer has been conformally formed on a first wall, on a second wall, and on a bottom wall of the second trench, resulting in a third trench within the electrolyte layer.
Figure 12:
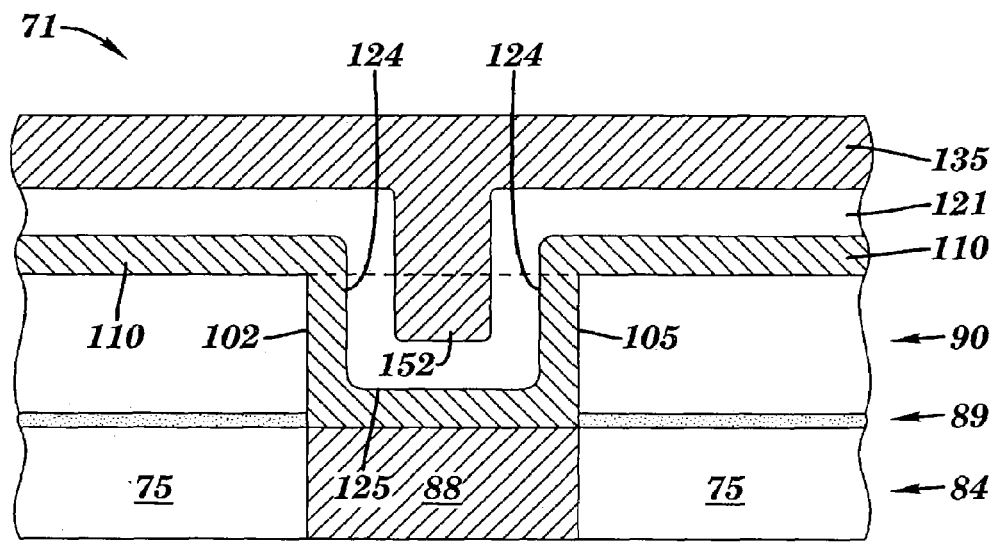
FIG. 12 depicts FIG. 11 after the third trench has been filled with a second conductive material.
Figure 13:
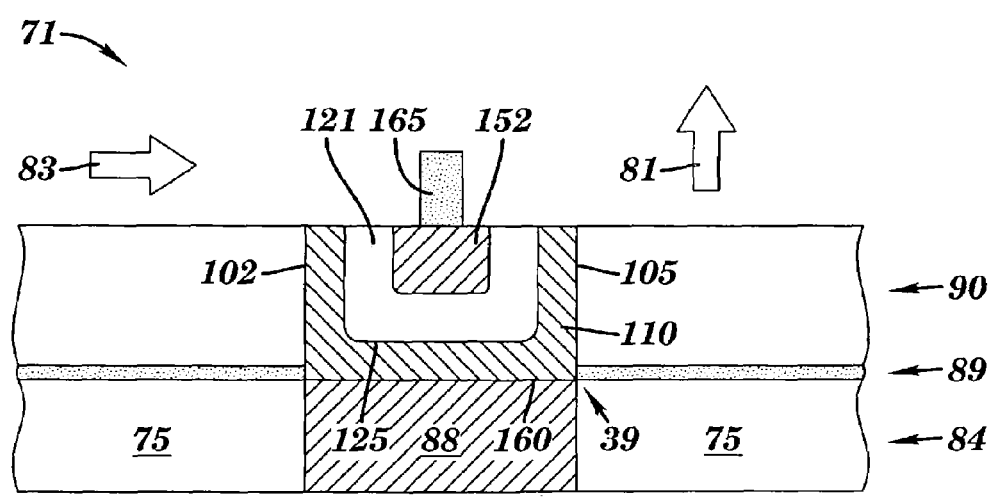
FIG. 13 depicts FIG. 12 after planarization to a top surface of the first ILD layer has removed portions of the second conductive material, the electrolyte layer, and the first conductive material, and after a conductive contact has been formed from a remaining portion of the second conductive material.

The battery 420 may be formed within the $J^{th}$ wiring level as described infra for forming a battery 38 associated with FIGS. 2–7, a battery 39 associated with FIGS. 8–13, or a battery 170 associated with FIG. 13. The battery 420 may be formed concurrently with other processes that would be ordinarily performed (e.g., forming vias photolithographically, adding metallization by damascene processing etc.) in relation to the $J^{th}$ wiring level. The battery 420 has a negative terminal 422 which is conductively coupled to the conductor 442. The battery 420 has a positive terminal 424 which is conductively coupled to the conductor 444. The battery 420 provides voltage to the FET 410 by: a conductive path from the positive terminal 424 to the conductor 444 to the conductive metallization representation 434 to the source/drain 412 of the FET 410, and a conductive path from the negative terminal 422 to the conductor 442 to the conductive metallization representation 432 to the source/drain 411 of the FET 410. As stated supra, the battery 420 is at the $J^{th}$ wiring level, and J stands for any positive integer in a range of $1 \leq J \leq N$. Thus the battery 420 may be formed at any wiring level of the integrated circuit 400. Alternatively, the battery 420 could be formed on a top surface 448 of the wiring level 900+N. Generally, the battery 420 could exist over a range of wiring levels such as from a wiring level 900+I through 900+K, wherein I may have any of the values 1, 2, ..., N, and K may have any of the values I, I+1, ..., N. Also generally, the battery 420 could stand for a single battery, multiple batteries in series as exemplified by FIGS. 15–17 discussed infra, or multiple batteries in parallel as exemplified by FIG. 18 discussed infra.

The wiring level configuration in FIG. 1 is a particular example, and many other wiring level configurations are possible. For example, although the battery 420 in FIG. 1 has been placed at the single wiring level 900+J the battery 420 could have been considered to exist at more than one wiring level. To illustrate, a battery 170 in FIG. 14, to be described infra, could comprise a first conductive layer 172 (which is an electrode), an electrolyte 174, and a second conductive layer 176 (which is an electrode), wherein each exists at a different wiring level. Alternatively, the first conductive layer 172, the electrolyte 174, and the second conductive layer 176 could be considered to collectively exist at a single wiring level. Similarly, conductive metallization can be assigned to wiring levels as desired. The foregoing forms of wiring levels have been presented for purposes of illustration and description, and are not intended to be exhaustive or to limit the invention to the precise form disclosed. Many modifications and variations are possible. Such modifications that may be apparent to a person skilled in the art are intended to be included within the scope of this invention as defined by the accompanying claims.

A constraint on wiring level notation is included herein, namely: a wiring level that includes a battery or a portion of a battery (e.g., an electrode of a battery) cannot extend beyond a physical extent of the battery in a direction 450. Thus in FIG. 1, a single wiring level cannot include both the battery 420 and the conductor 442, because the conductor 442 is beyond the physical extent of the battery 420; i.e., the conductor 442 does not occupy space that is between the positive terminal 424 and the negative terminal 422 of the battery 420. In contrast, multiple wiring levels could be defined between the positive terminal 424 and the negative terminal 422 of the battery 420, because each such wiring level of the multiple wiring levels would not extend beyond a physical extent of the battery 420. Also note that a battery may be included within multiple wiring levels. For example, a battery may be included within two wiring levels such that a first electrode of the battery is in a first wiring level of the two wiring levels, and an electrolyte and a second wiring level of the battery is in a second wiring level of the two wiring levels. The aforementioned constraint on wiring level notation serves to clarify features of the present invention with respect to how placement of conductive metallization is related to placement of the battery.

Figure 19:
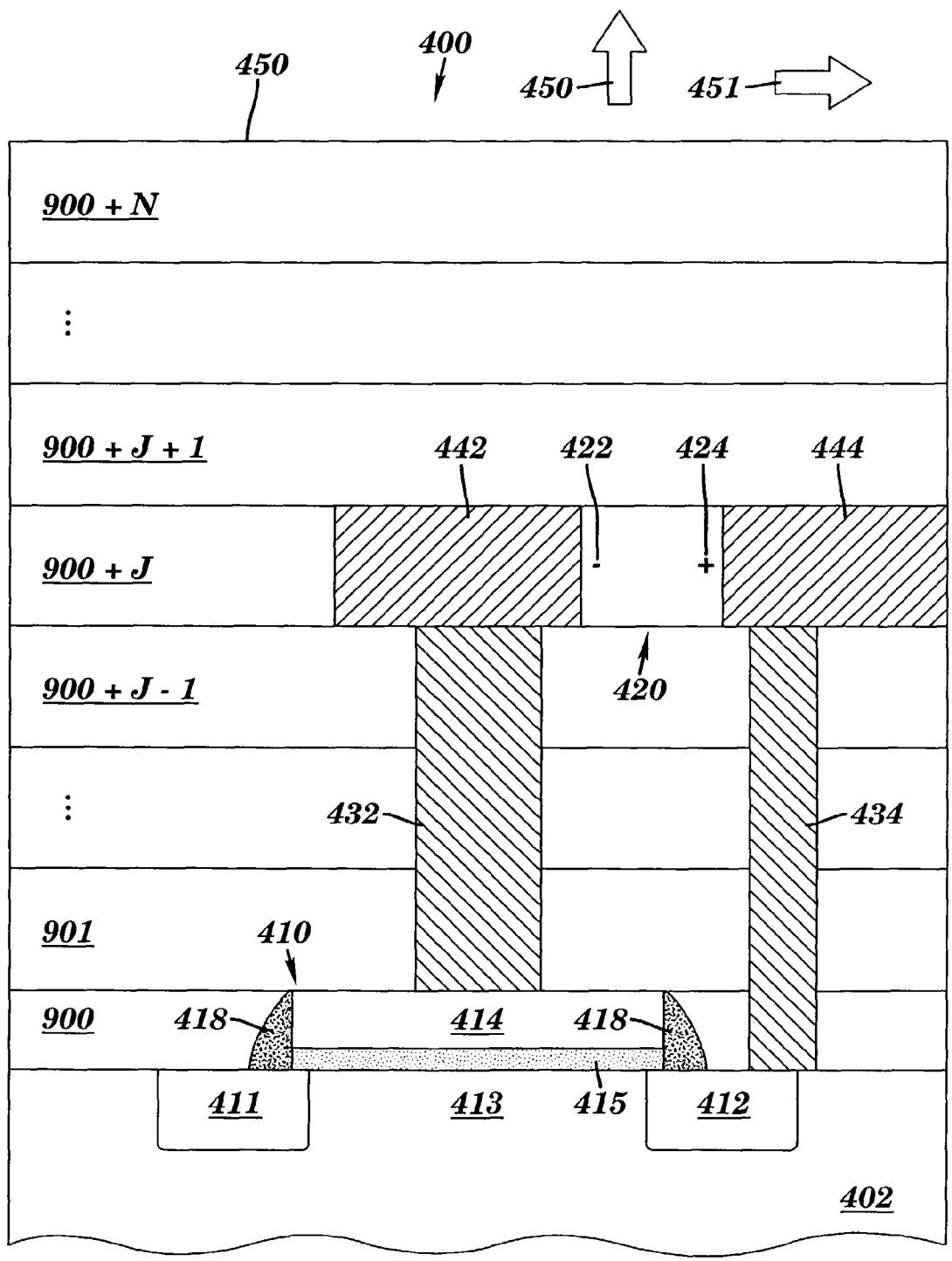
FIG. 19 depicts FIG. 1 with the battery rotated 90 degrees and the conductive metallization resized for compatibility with the rotated battery.

Neither of the conductors 444 and 442 are in the same wiring level 900+J (or same multiple wiring levels within 900+J if so defined) in which the battery 420 is located. However, the battery 420 could be rotated 90 degrees (i.e., from the direction 450 to a direction 451). Such rotation could result in a positioning of the positive and negative terminals of the battery 420, as illustrated in FIG. 19, such that conductors (such as the conductors 444 and 442) to said positive and negative terminals would be located in the same wiring level 900+J (or same multiple wiring levels within 900+J if so defined) in which the battery 420 is located. In summary, the scope of the present invention includes two possibilities for placement of the conductors 444 and 442 in relation to where the battery 420 is located. The first possibility is that the conductors 444 and 442 are both outside of the same single wiring level or the same multiple wiring levels in which the battery 420 is located. The second possibility is that the conductors 444 and 442 are both within the same single wiring level or the same multiple wiring levels in which the battery 420 is located.

Several battery topologies are presented herein as depicted in FIGS. 20A, 20B, 20C, and 21. The battery topologies presented herein include a U-Battery, a U-Battery With Extension, and a S-Battery.

Figure 20A:
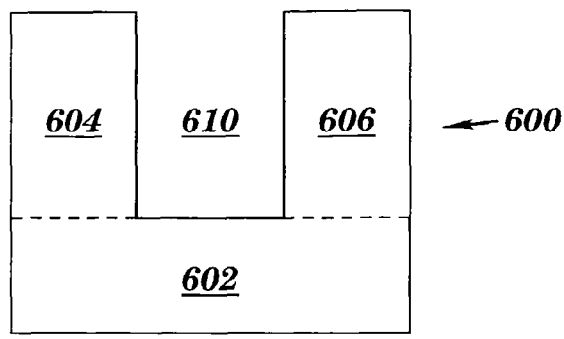
FIG. 20A depicts an electrolyte of a U-battery, in accordance with embodiments of the present invention.

FIG. 20A illustrates an electrolyte 600 of a U-battery, in accordance with embodiments of the present invention. The electrolyte 600 has a shape of a "U" (in cross-sectional view) and includes: a base 602, an arm 604, and an arm 606. The base 602, arm 604, and arm 606 collectively define a cavity 610.

Figure 20B:
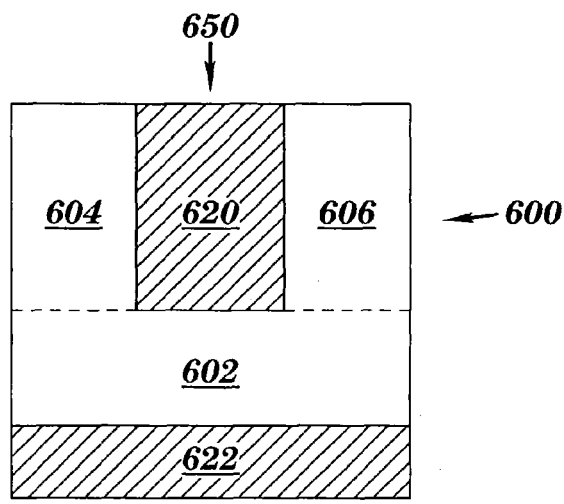
FIG. 20B depicts a U-Battery that includes the electrolyte of FIG. 20A.

FIG. 20B illustrates a U-Battery 650 that includes the electrolyte 600 of FIG. 20A, in accordance with embodiments of the present invention. The cavity 610 has been partially or fully filled with conductive material to form a cavity electrode 620. A base electrode 622 having conductive material contacts a portion of the base 602 of the electrolyte 600. Generally, the electrolyte 600 of the U-battery 650 is not required to have an exact shape of a "U", but must have a base, 2 arms, and a cavity such that when the cavity is partially or totally filled with conductive material, the conductive material of the resultant cavity electrode is in contact with the base and the 2 arms.

Figure 20C:
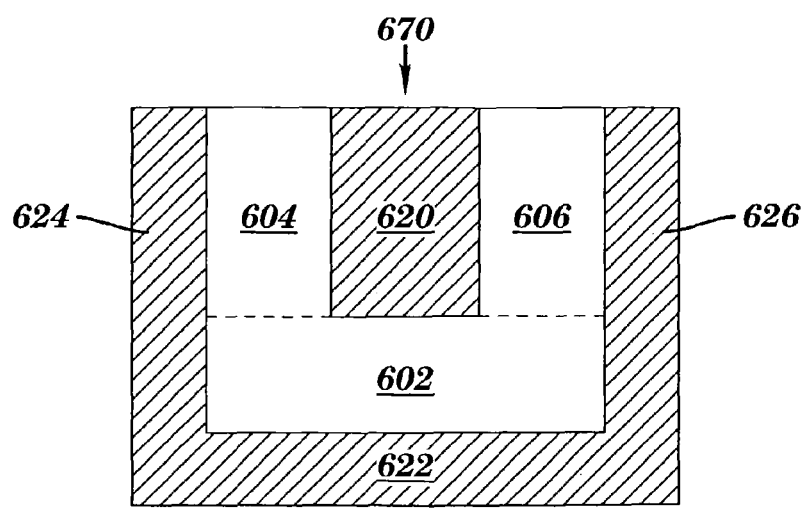
FIG. 20C depicts the U-Battery of FIG. 20C after addition of Extensions.

FIG. 20C illustrates the U-Battery 650 of FIG. 20B after addition of extensions 624 and 626 to form a U-Battery With Extensions 670. The extensions 624 and 626 each include the conductive material of the base electrode 622 and must contact a portion of the arms 604 and 606, respectively, of the electrolyte 600. If both extensions 624 and 626 are present, then the battery 670 is a U-Battery With Double Extension. If either extension 624 or extension 626, but not both, is present, then the battery 670 is a U-Battery With Single Extension.

The battery of the present invention eliminates a need to use external voltage sources for particular applications requiring nonstandard voltage bias or nonstandard reference voltage. Additionally, the battery of the present invention avoids using external voltage sources or external current sources which supply voltage or current, respectively, to integrated circuits that require low-power input, wherein such external voltage sources or external current sources require more wiring levels, have a larger size, or occupy a larger volume, than desired. For example, the battery may be advantageously used in a biomedical application in which a sensor may be placed on a catheter intended for insertion into a person's body. The sensor would include the battery in an integrated circuit for powering the circuits of the sensor. As another example, the battery of the present invention may be formed within low-power integrated circuits on disk-drive heads, wherein the battery would supply the power required by the disk heads and could be periodically recharged. Further, thermal cycling in relation to the battery is reduced during BEOL integration in comparison with FEOL processing, since the battery will be subjected to lower temperatures that occur during BEOL integration. The reduced thermal cycling is advantageous, since the battery may include, inter alia, highly reactive lithium or lithiated vanadium oxide ($Li_8V_2O_5$).

FIGS. 2–7 depict an apparatus and method for forming a battery during BEOL integration for use within an integrated circuit (e.g., the integrated circuit 400 described supra in conjunction with FIG. 1), in accordance with embodiments of the present invention.

Figure 2:
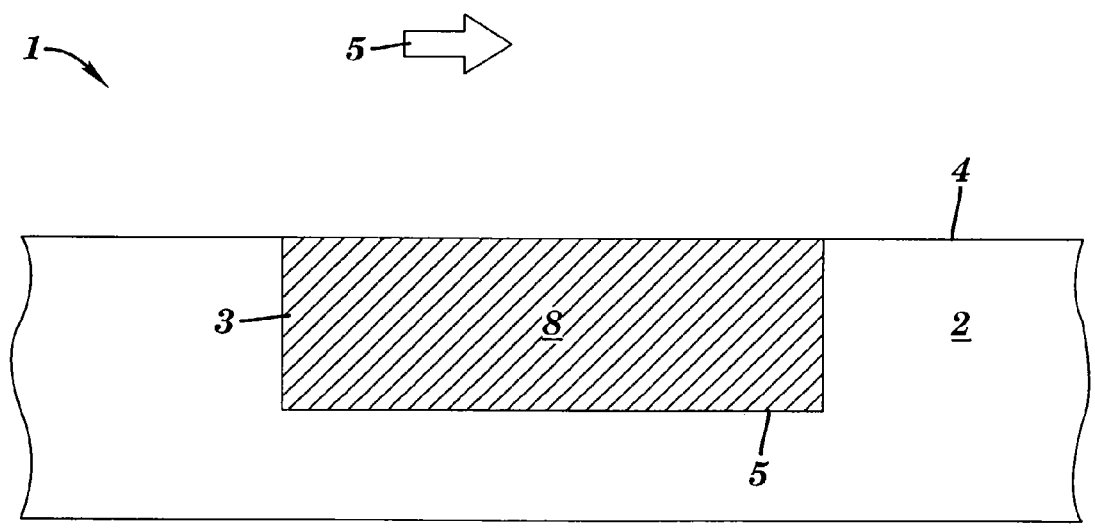
FIG. 2 depicts a front cross-sectional view of a first electrochemical structure comprising a substrate and a first conductive layer within the substrate, in accordance with embodiments of the present invention.

FIG. 2 depicts a front cross-sectional view of a first electrochemical structure 1, comprising a substrate 2 that includes any dielectric material such as $SiO_2$ or the like and a first conductive layer 8 within the substrate 2, wherein the first conductive layer 8 is formed using any method known to one of ordinary skill in the art, such as a damascene procedure described by Beyer in 1999 (U.S. Pat. No. 5,965,459, herein incorporated by reference). The substrate 2 represents a portion of a wiring level (e.g., any one of the wiring levels 901, 902, . . . , 900+N described supra in conjunction with the integrated circuit 400 of FIG. 1), wherein the wiring level includes conductive metallization embedded within dielectric material. The substrate 2 has been deposited on a surface below such as on the layer of electronic devices 900, or on one of the wiring levels 901, . . . , 900+J. . . . , 900+N, described supra in conjunction with FIG. 1, using any method known to one of ordinary skill in the art.

The substrate 2 has been patterned and etched by any method known to one of ordinary skill in the art such as, inter alia, a photolithographic method, thus defining and forming a shallow first trench 3, having a width in the direction 5 that includes from about 0.3 µm (i.e., microns) to about 5 µm, and a height that includes from about 0.3 µm to about 5 µm. The shallow first trench 3 has been filled with a first conductive material, followed by polishing, such as by chemical mechanical polishing (CMP), to remove excess first conductive material and to planarize a top surface 4 of the processed substrate 2. Filling the shallow first trench 3 with the first conductive material forms the first conductive layer 8. The first conductive layer 8 may be formed using reactive sputtering of vanadium as described by Bates et al., in 1994 (U.S. Pat. No. 5,338,625, herein incorporated by reference) or by any method known by one of ordinary skill in the art. When the first conductive material is $V_2O_5$, the first conductive material functions as a cathode of an electrolytic cell. When the first conductive material is $Li_8V_2O_5$, or lithium, the first conductive material functions as an anode of an electrolytic cell. An electrolytic cell derived from the electrochemical structure 1 is a battery 38 shown infra in FIG. 5.

Figure 3A:
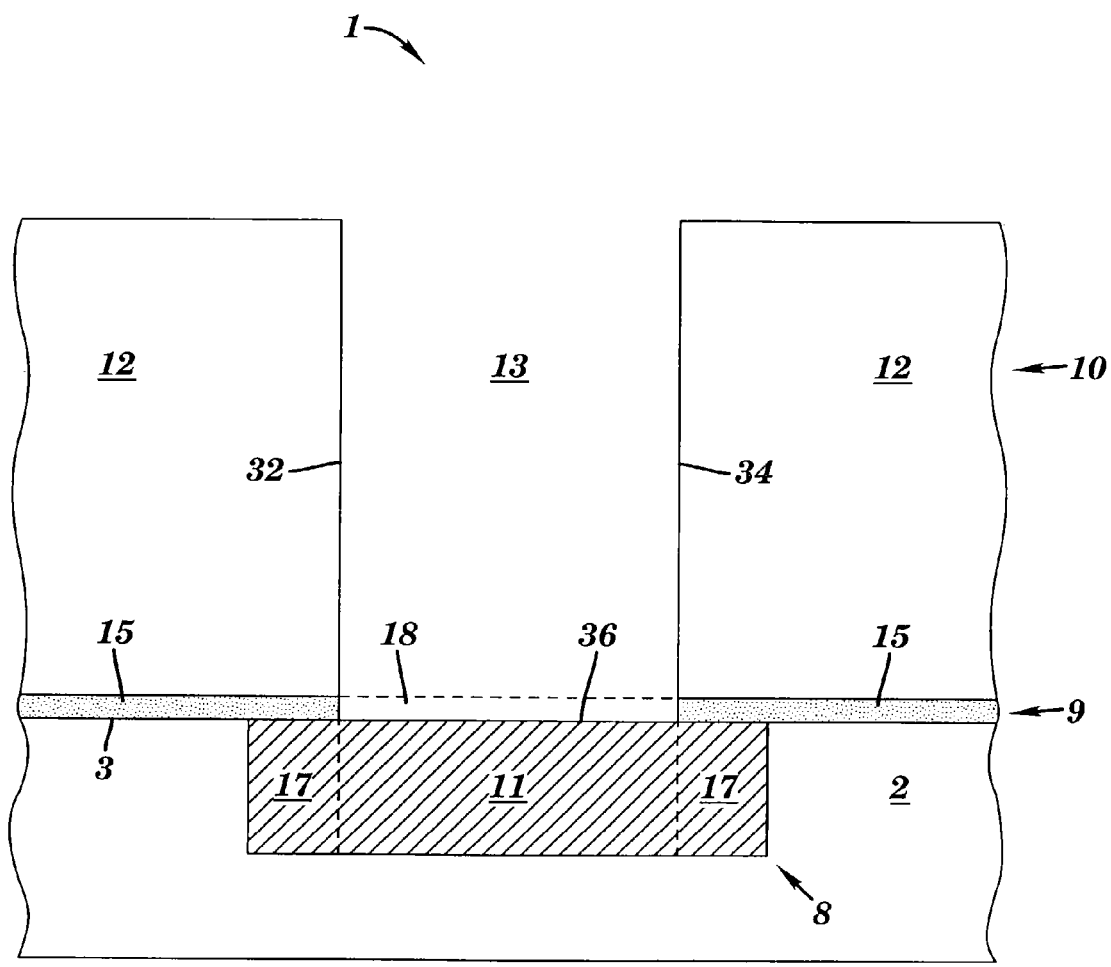
FIG. 3A depicts FIG. 2 after depositing an etch stop layer and a first inter-level dielectric (ILD) layer on the substrate and exposing a first portion of the first conductive layer by forming a second trench within a first ILD layer and the etch stop layer.

FIG. 3A depicts FIG. 2 after sequentially forming an etch stop layer 9 (e.g. a silicon nitride layer) on the planarized substrate 2, and a first inter-level dielectric (ILD) layer 10 on the etch stop layer 9. The etch stop layer 9 and the first ILD layer 10 may be formed by any method known to one of ordinary skill in the art. The etch stop layer 9 acts as a barrier to etching and to prevent chemical diffusion of residual ions into the substrate 2 from subsequent patterning, wet chemical etching or planarization steps that will be described infra in relation to FIG. 5. The etch stop layer 9 has a thickness between about 0.015 µm and about 0.3 µm. If the etch-stop functionality of the etch stop layer 9 is not needed, the etch stop layer 9 may be omitted. The first inter-level dielectric ILD layer 10 has a thickness between about 0.285 µm and about 4.7 µm.

A second trench 13 is formed in the first ILD layer 10 by any method known to one of ordinary skill in the art, such as in the following two steps. In the first step, the first ILD layer 10 is patterned and etched, using any appropriate photolithographic method known to one of ordinary skill in the art. The patterning and etching removes a portion of the first ILD layer 10, and leaves a remaining portion 12 of the first ILD layer 10 on the etch stop layer 9. In the second step, a first portion 18 of the etch stop layer 9 is patterned and etched, removing the first portion 18 of the etch stop layer 9 which leaves a second portion 15 of the etch stop layer 9 on a first portion 17 of the first conductive layer 8 and exposes a second portion 11 of the first conductive layer 8.

If the second trench 13 has a rectangular cross-section, then the second trench 13 has a first wall 32 and a second wall 34, and a bottom wall that is about coplanar with a surface 36 of the exposed second portion 11 of the first conductive layer 8. Alternatively, the second trench 13 may have a circular cross section.

Figure 3B:
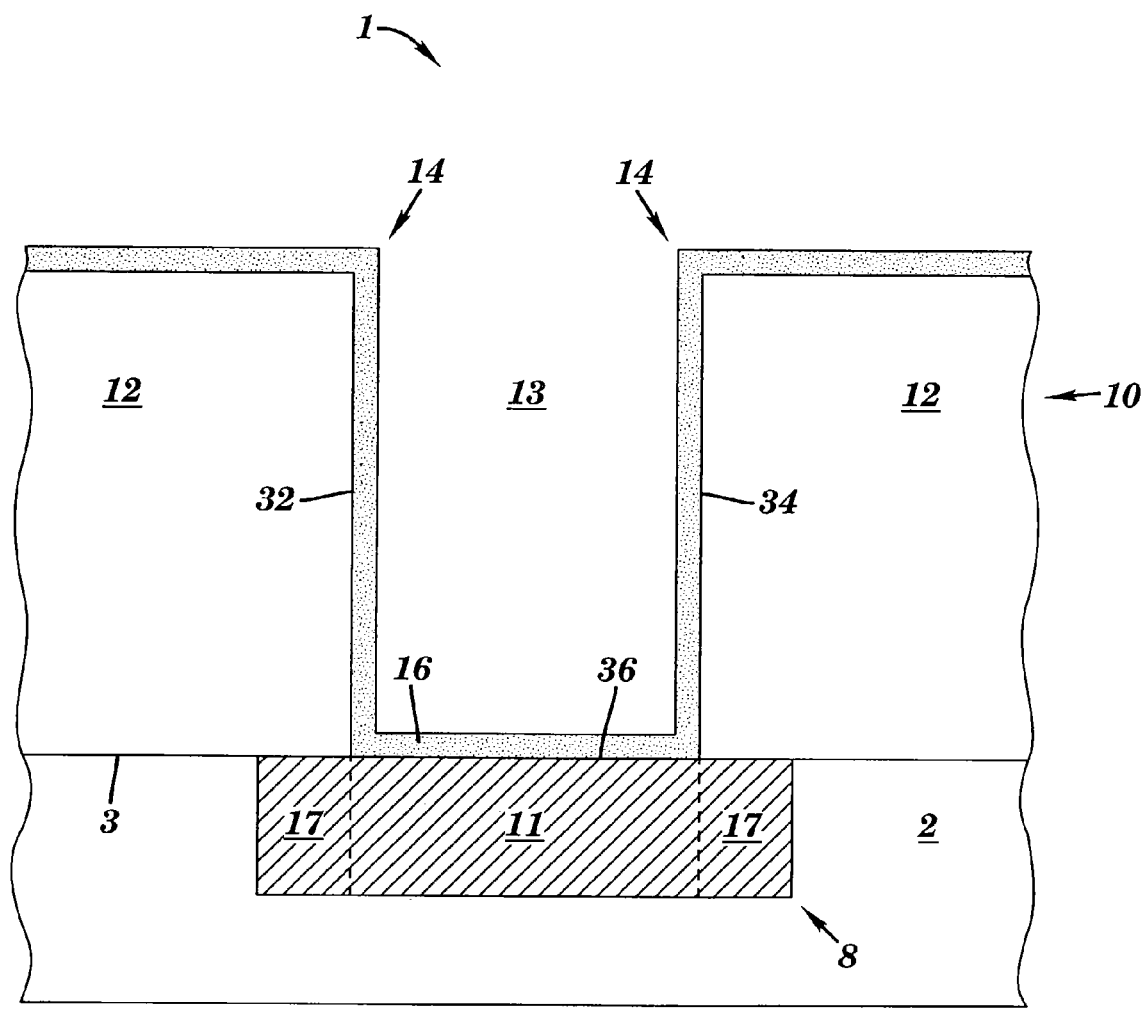
FIG. 3B depicts FIG. 3A with the etch stop layer replaced by a diffusion barrier film on a top surface of the first ILD layer, on first wall and a second wall of the second trench, and on a surface of the first conductive layer.

FIG. 3B, which is an alternative to FIG. 3A, depicts FIG. 3A with the etch stop layer 9 of FIG. 3 replaced by a diffusion barrier film 14 on a top surface of the first ILD layer 10, on the first wall 32 and the second wall 34 of the second trench 13, and on a surface 36 of the first conductive layer 8. The diffusion barrier film 14 may be deposited by any method known to one of ordinary skill in the art. The diffusion barrier film 14 serves as diffusion barrier to prevent leakage of impurities into the bulk semiconductor wafer (e.g., the bulk semiconductor wafer 402 in FIG. 1) and into the device layer just above the bulk semiconductor wafer (e.g., the layer 900 in FIG. 1). Such impurities may originate from, inter alia, an electrolyte of a battery within the electrochemical structure 1. For example in FIG. 1, impurities may leak from an electrolyte of the battery 420 through the conductor 442 and the conductive metallization representation 432 into the gate 414 of the FET 410. As another example, impurities may leak from an electrolyte of the battery 420 through the conductor 444 and the conductive metallization representation 434 into the source/drain 412 of the FET 410. The material of the diffusion barrier film 14 should be electrically conductive so as not to electrically insulate the first conductive layer 8 from an electrolyte layer 41 (the electrolyte layer 41 will be subsequently formed as discussed infra in conjunction with FIGS. 4–5). Alternatively, the diffusion barrier film 14 need not be electrically conductive if a bottom portion 16 of the diffusion barrier film 14 is removed such as by, inter alia, reactive ion etching (RIE), which would avoid electrically insulating the first conductive layer 8 from the electrolyte layer 41. To effectively act as a diffusion barrier, the diffusion barrier film 14 should have a minimum thickness that depends on the material of the diffusion barrier film 14, and the minimum thickness of about 50 Å is representative for some materials. Although FIGS. 4–7 (to be discussed infra) show the etch stop layer 9 of FIG. 3A, the diffusion barrier film 14 of FIG. 3B could alternatively be used in FIGS. 4–7 instead of the etch stop layer 9. Similarly, although FIGS. 8–18 (to be discussed infra) show an etch stop layer 89 (see, in particular, FIG. 9) which is analogous to the etch stop layer 9 of FIGS. 3A and 4–7, FIGS. 8–18 could have alternatively use a diffusion barrier film (e.g., the diffusion barrier film 14 of FIG. 3B) instead of the etch stop layer 89.

Figure 4:
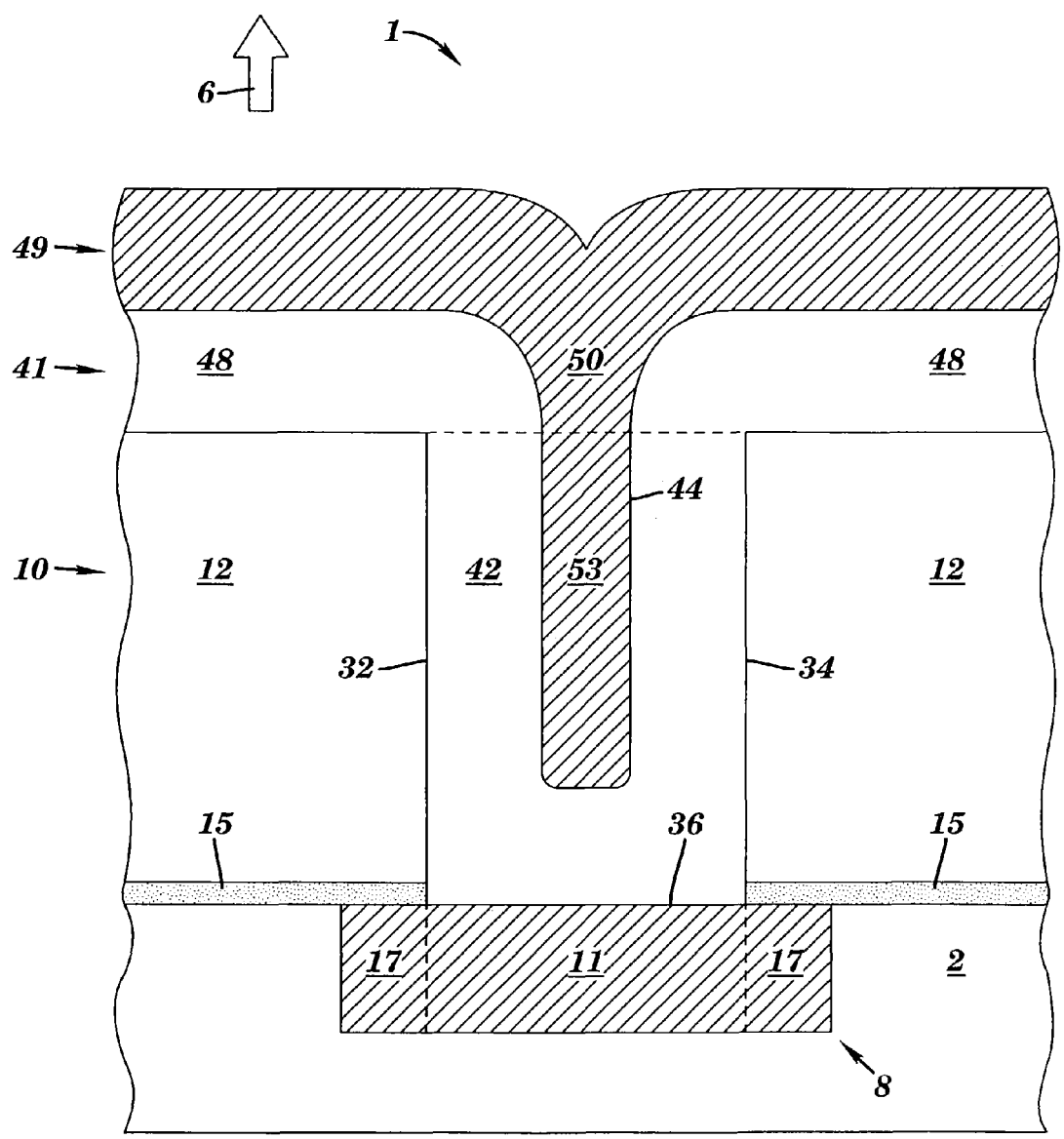
FIG. 4 depicts FIG. 3A after an electrolyte layer has been conformally formed on a wall of the second trench and on the first portion of the first conductive layer resulting in a third trench within the electrolyte layer, and after the third trench has been filled with a second conductive material.

FIG. 4 depicts FIG. 3A after conformally forming an electrolyte layer 41 on the remaining portion 12 of the first ILD layer 10, on the first wall 32 of the second trench 13, on the second wall 34 of the second trench 13, and on the surface 36 of the second portion 11 of the first conductive layer 8, resulting in a third trench 44 within the electrolyte layer 41. The third trench 44 may have, inter alia, a rectangular or cylindrical cross-section in a plane about normal to a direction 6. The electrolyte layer 41, comprises a first portion 48 above the first ILD layer 10, and a second portion 42 within the first ILD layer 10. The electrolyte layer 41, may be formed by any method known to one of ordinary skill in the art such as a method described by Bates et al. in 1994 (U.S. Pat. No. 5,338,625). According to Bates, an electrolyte material such as lithium phosphorous oxynitride (Lipon) or like materials may be conformally deposited to about a uniform thickness between about 0.11 μm and about 1.8 μm by known methods, such as rf magnetron sputtering of $Li_3PO_4$ in $N_2$. A second conductive layer 49 has been conformally formed on the electrolyte layer 41, wherein the second conductive layer 49 comprises a first portion 50 above the first portion 48 of the electrolyte layer 41 and a second portion 53 within the second portion 42 of the electrolyte layer 41. The second conductive layer 49 includes a second conductive material such as lithium metal or lithiated vanadium oxide ($Li_8V_2O_5$), such that the third trench 44 has been filled with the second conductive material. Similarly, Bates et al. described in U.S. Pat. No. 5,338,625 depositing a film of lithium metal on a film of lithium phosphorous oxynitride (Lipon) electrolyte.

Figure 5:
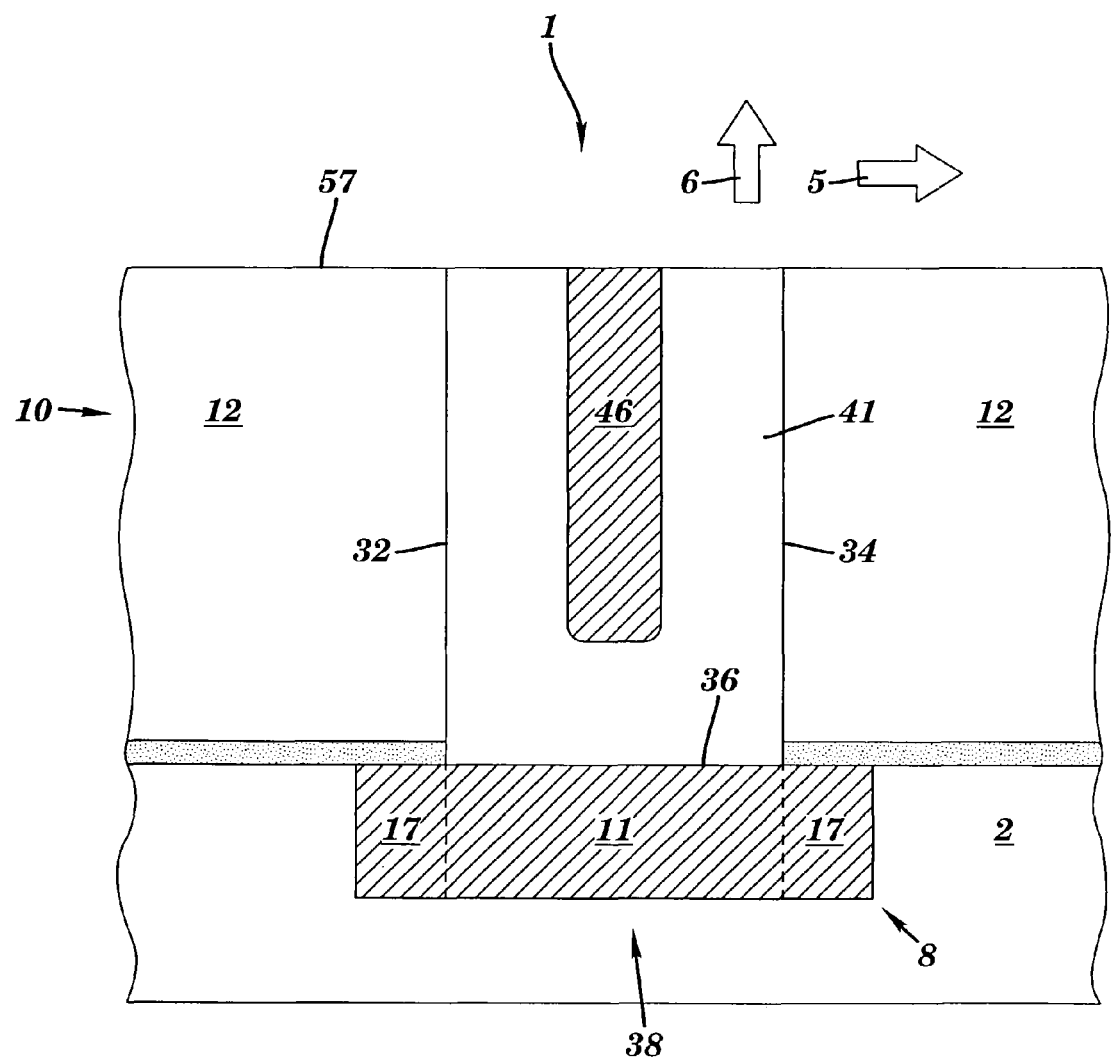
FIG. 5 depicts FIG. 4 after planarization to a top surface of the first ILD layer to remove excess electrolyte material of the electrolyte layer and excess second conductive material.

FIG. 5 depicts FIG. 4 after planarization using any method known to one of ordinary skill in the art, such as CMP, removes the first portion 50 of the second conductive layer 49 and the first portion 48 of the electrolyte layer 41, leaving a top surface 57 of the planarized structure 1. In the example depicted in FIG. 5, planarization of the structure 1 results in formation of a conductive metal plug or contact 46 (formerly the second portion 53 of the second conductive layer 49 in FIG. 3A) having a height (in the direction 6) such as from about 0.225 μm to about 3.8 μm, and a width (in the direction 5) such as from about 0.08 μm to about 1.4 μm. The electrolyte layer 41 (i.e., the second portion 42 as shown in FIG. 4) separates the second conductive material of the conductive metal plug or contact 46 from the second portion 11 of the first conductive layer 8.

The structure 1 depicted in FIG. 5 includes an electrolytic cell or battery 38, wherein the first conductive layer 8 and the first conductive plug or contact 46 are electrodes, and wherein the electrolyte layer 41 provides a medium in which ions such as lithium ions, or ions of other alkali metals, migrate from an anode of the battery 38 to a cathode of the battery 38. For example, in the battery 38, if the conductive plug or contact 46 is an anode because it is derived from second conductive materials such as lithium metal or $Li_8V_2O_5$, and the first conductive layer 8 is a cathode because it is derived from first conductive materials such as $V_2O_5$, then the lithium ions migrate from the conductive plug or contact 46 to the first conductive layer 8 during a discharge cycle of the battery. Alternatively, in the battery 38, if the first conductive layer 8 is the anode because it is derived from first conductive materials such as lithium or $Li_8V_2O_5$, and the conductive plug or contact 46 is the cathode because it is derived from second conductive materials such as $V_2O_5$, then the lithium ions migrate from the first conductive layer 8 to the conductive plug or contact 46 during the discharge cycle of the battery.

If the electrodes 8 and 46 are electrodes of a thin film lithium battery, then the electrodes 8 and 46 may comprise materials such as described by Lee et al., wherein a cathode is $V_2O_5$, an electrolyte is lithium phosphorous oxynitride (Lipon), and an anode is $Li_8V_2O_5$. See "All-Solid-State Rocking Chair Lithium Battery on a Flexible Al Substrate," Electrochemical and Solid-State Letters, 2(9) 425–427 (1999), herein incorporated by reference. Bates, in 1996 (U.S. Pat. No. 5,567,210, herein incorporated by reference), described performance characteristics that relate surface area to output of lithium/Lipon/$V_2O_5$ batteries. Bates states that an amorphous $LiMn_2O_4$ cathode provides a lower discharge rate than does a crystalline $LiCoO_2$ cathode, and recommends the amorphous $LiMn_2O_4$ cathode for applications requiring ambient temperature battery fabrication. See John B. Bates' Material, v1-5/1/98, URL "http://www.ccs.oml.gov/3M/bates.html," herein incorporated by reference. See also, Park et al., "All-Solid-State Lithium Thin-Film Rechargeable Battery With Lithium Manganese Oxide," Electrochemical and Solid State Letters, 2(2) Feb. (1999) 58–59, herein incorporated by reference, (describing thin film batteries comprising Li/Lipon/$LiMn_2O_4$ having "a nearly constant potential of 4.0 [volts] V, good coulombic efficiency and the capability of carrying high current density. Planar microbatteries were connected in series through metallization." Park et al. described infra high voltages of approximately 32 volts (V) could be obtained from eight batteries connected in series). Kurokawa et al., in 1994 (U.S. Pat. No. 5,308,720, herein incorporated by reference), disclosed a non-aqueous battery comprising an anode made up of "material which occludes and releases lithium reversibly, a non-aqueous electrolyte and a positive electrode which has a composite oxide which includes lithium, nickel and oxygen." An alternative electrolytic cell comprises $M/PbSnI_4/$ (AgI, Ag), wherein M is a cathode and is either Sn or Pb, wherein $PbSnI_4$ is an electrolyte, and wherein AgI and Ag are the anode. See T. A. Kuku, "Ion Transport Studies on Vacuum Deposited $PbSnI_4$ Thin Films," Thin Solid Films, 340 (1) 292–296 (1999), herein incorporated by reference. Gregor proposed formation of a thin film battery that is suitable as a microminiature component to supply biasing potentials to field effect transistors on a substrate, comprising alternating films of a silver (Ag) cathode, silver oxide ($Ag_2O$) electrolyte and a copper (Cu) anode. See "Thin Film Voltage Source," IBM Technical Disclosure Bulletin, November 1964, p. 433, herein incorporated by reference. Further, an electrolytic cell may comprise Ag/Zn batteries using potassium hydroxide electrolyte in water.

Figure 6:
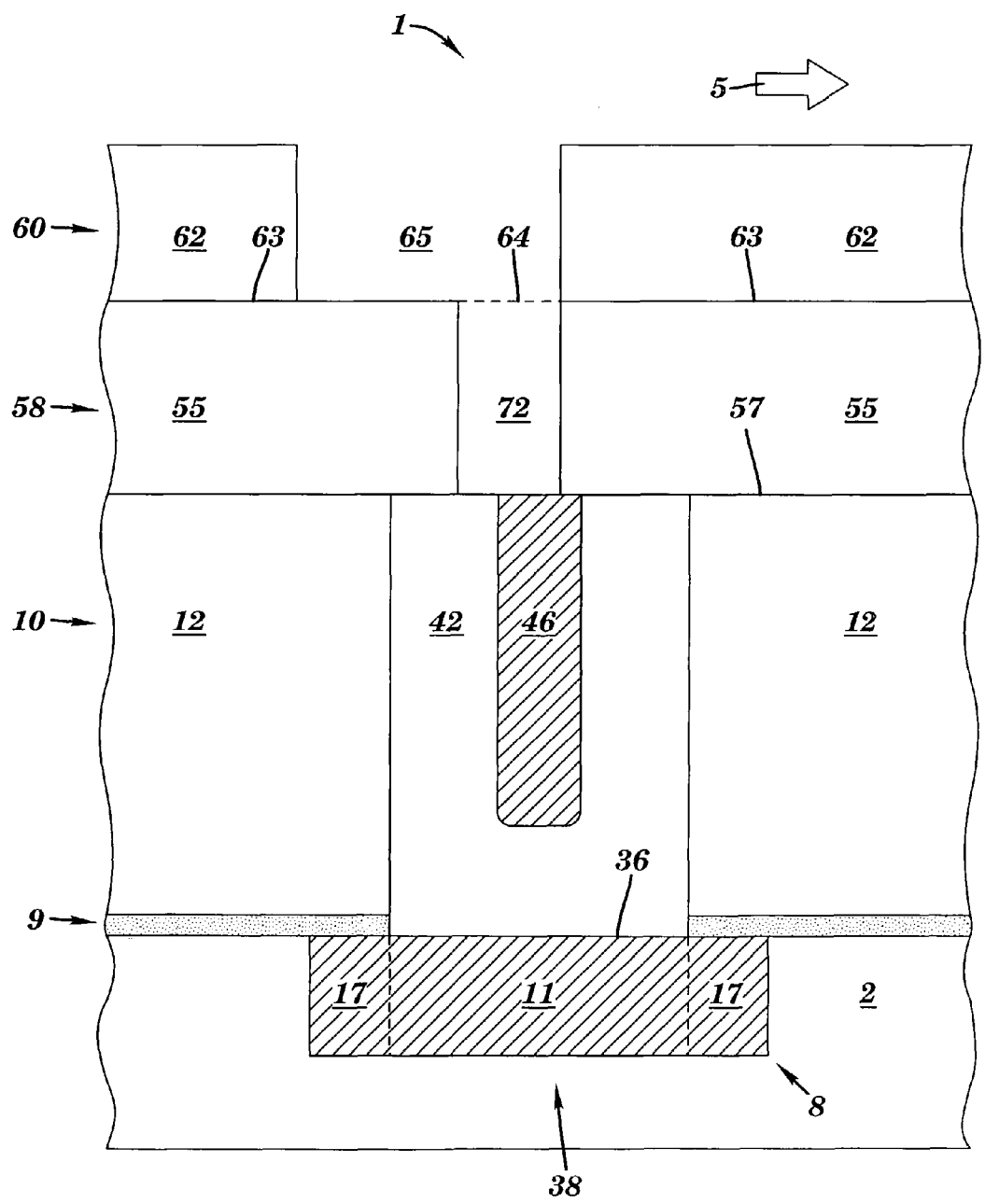
FIG. 6 depicts FIG. 5 after forming a second ILD and a third ILD layer on the top surface of the first ILD layer and forming an inter-connecting via and a contact hole within the third ILD layer and the second ILD layer, respectively.

FIG. 6 illustrates FIG. 5 after forming a path to the conductive metal plug or contact 46, wherein the path comprises an inter-connecting via 65 and a contact hole or via 72. The path to the conductive metal plug or contact 46 may be formed using techniques known to one skilled in the art such as a "dual damascene" technique. For example, Cronin et al., in 1998 (U.S. Pat. No. 5,759,911, herein incorporated by reference), described a "dual damascene" technique in which two masks are used to form patterned conductive lines simultaneously, with formation during BEOL integration of stud via connections through an insulating layer to underlying metallization in an integrated circuit. See also Cronin, in 1999 (U.S. Pat. No. 5,960,254, herein incorporated by reference), describing a dual damascene technique. See also Chow et al., in 1988 (U.S. Pat. No. 4,789,648, herein incorporated by reference), describing the dual damascene technique. In preparation for using the dual damascene technique in the present invention, a second ILD layer 58 having a thickness between about 0.15 µm and about 2.5 µm and comprising inter-level dielectric materials such as, inter alia, sputtered quartz, has been formed on the planarized surface 57. The contact hole or via 72 has been defined using photolithography by forming a first mask layer 63 of photoresist on the second ILD layer 58 by a method known to one of ordinary skill in the art. Alignment is facilitated by standard alignment means such as described by Cronin et al., in U.S. Pat. No. 5,759,911. An etch stop layer (not shown) may be deposited on the second ILD layer 58 or on the first mask layer 63. A third ILD layer 60 comprising inter-level dielectric materials such as, inter alia, sputtered glass or the like is formed on the second ILD layer 58 and on the first mask layer 63.

The third ILD layer 60 has been patterned using a second mask as required by the "dual damascene" technique, and etched using an appropriate method of patterning and etching known to a one of ordinary skill in the art. As a result, the inter-connecting via 65 is formed within the third ILD layer 60 by removing a portion of the third ILD layer 60 to the first mask layer 63 and leaving a remaining portion 62. Additionally, the contact hole or via 72 is formed within the second ILD layer 58 by removing a portion of the second ILD layer 58 that is not protected from etching by the first mask 63, leaving a remaining portion 55 of the second ILD layer 58.

Figure 7:
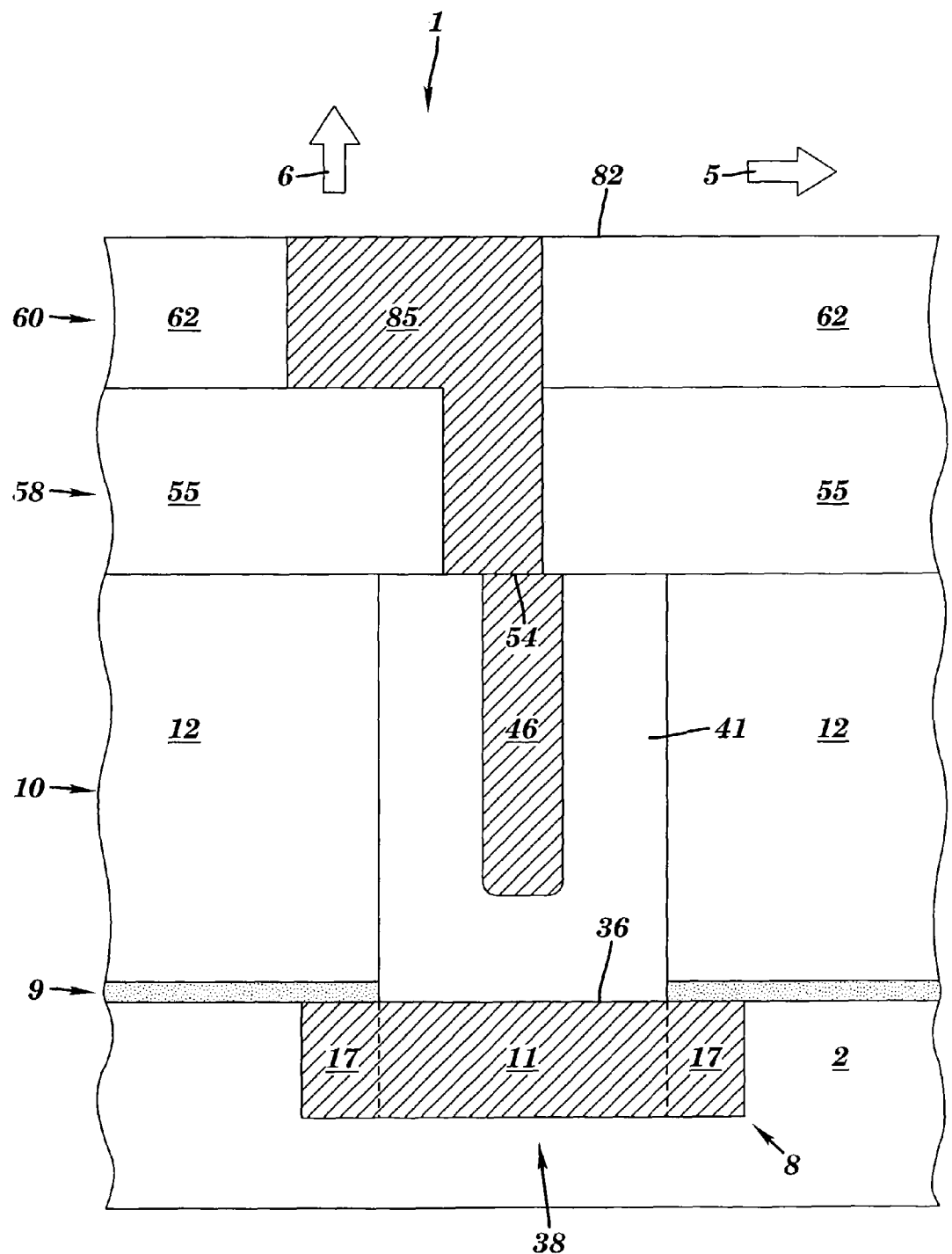
FIG. 7 depicts FIG. 6 after the inter-connecting via and the contact hole have been filled with a third conductive material and wherein an excess of the third conductive material has been removed by planarization.

FIG. 7 illustrates FIG. 6 after a second conductive plug or contact 85 has been formed by filling the inter-connecting via 65 and the contact hole or via 72 with a third conductive material. The third conductive material may include any conductive material such as, inter alia, Cu, W, Al, TiN, Ta, or similar metals. Excess third conductive material is removed by etching or CMP techniques know by those of ordinary skill in the art, resulting in a planarized top surface 82 of the electrochemical structure 1. The planarization has formed a top surface 82 of the third ILD layer 60 and of the second conductive plug or contact 85. The second conductive plug or contact 85 extends from the top surface 82 to the first conductive plug or contact 46.

If the inter-connecting hole or via 65 and the contact via 72 have rectangular cross-sections, then: a height in the direction 6 from the top surface 82 to a top surface 54 the first conductive plug or contact 46 includes from about 0.2 µm to about 3.7 µm; a width of the contact hole or via 72 (see FIG. 6) in the direction 5 includes from about 0.07 µm to about 1.2 µm; and a width of the inter-connecting via 65 (see FIG. 6) in the direction 5 includes from about 0.17 µm to about 2.9 µm.

The second ILD layer 58 and the third ILD layer 60, in combination, is a composite ILD layer. Generally, a composite ILD layer includes one or more stacked ILD layers. Similarly, the inter-connecting via 65 and the contact hole or via 72 (see FIG. 6), in combination, is a composite trench. Generally, a composite trench includes one or more sequentially stacked trenches such that successive trenches overlap, partially or fully. For example, the interconnecting via 65 and the contact hole or via 72 are trenches that overlap at an interface 64 (see FIG. 6).

The battery 38 of FIG. 7 is an example of a U-Battery as described supra in conjunction with FIGS. 20A and 20B.

Relating the electrochemical structure 1 of FIG. 7 to the integrated circuit 400 of FIG. 1, the battery 38 is at the wiring level 900+J, and the second conductive plug or contact 85 is at the wiring level 900+J+1. Thus, the second conductive plug or contact 85 extends conductive coupling of the battery 38 to other wiring levels which are conductively coupled to one or more electronic devices to be powered by the battery 38. For example, the second conductive plug or contact 85 is analogous to the conductor 444 of FIG. 1, described supra as conductively coupling to the FET 410 via the conductive metallization representation 434 of FIG. 1.

FIGS. 8–13 depict an apparatus and method for forming a battery during BEOL integration for use within or on an integrated circuit (e.g., the integrated circuit 400 described supra in conjunction with FIG. 1), in accordance with embodiments of the present invention.

Figure 8:
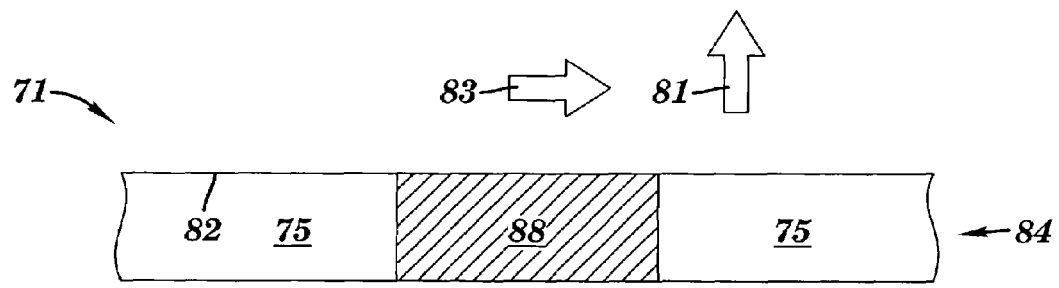
FIG. 8 depicts a front cross-sectional view of a second electrochemical structure comprising a first conductive plate within an insulating layer, in accordance with embodiments of the present invention.

FIG. 8 depicts a front cross-sectional view of an electrochemical structure 71, comprising an insulating layer 84 that includes an insulating material 75 and a first conductive plate 88. The insulating layer 84 represents a wiring level (e.g., any one of the wiring levels 901, ..., 900+N described supra in conjunction with the integrated circuit 400 of FIG. 1), wherein the wiring level includes conductive metallization embedded within dielectric material. The insulating material 75 includes any dielectric material such as $SiO_2$ or the like.

The insulating layer 84 is typically formed on the layer of electronic devices 900, or on one of the wiring levels 901, ..., 900+J. ..., 900+N, of FIG. 1 described supra, using any method known to one of ordinary skill in the art. For example, chemical vapor deposition (CVD) or a similar technique may be used to form the insulating layer 84. The insulating material 75 includes insulating materials such as planarized $SiO_2$, a glass material (e.g., re-flowed phosphosilicate glass), a composite of $SiO_2$ and silicon nitride, or a polymer (e.g., a polyimide). If the insulating material 75 comprises silicon nitride (i.e. $Si_3N_4$), plastics, or like materials, then the $Si_3N_4$, plastics, etc. may further act as an ionic barrier to prevent residual ions that remain behind after processing from contaminating underlying integrated chip circuitry such as the layer of electronic devices 900 and thus prevent impairment of a functioning of the underlying integrated circuit circuitry. The residual ions may include, inter alia, alkali metal ions such as lithium and sodium ions, or chloride ions. The processing may include, inter alia, wet chemical etching and chemical mechanical polishing (CMP) of the top surface 82 of the insulating layer 84.

The first conductive plate 88 is formed by any method known to one of ordinary skill in the art, such as using a damascene procedure described by Beyer in 1999 in U.S. Pat. No. 5,965,459. A width (in a direction 83) of the first conductive plate 88 includes from about 0.3 μm to about 5 μm, and a height of the first conductive plate 88 (in a direction 81) includes from about 0.3 μm to about 5 μm.

Figure 9:
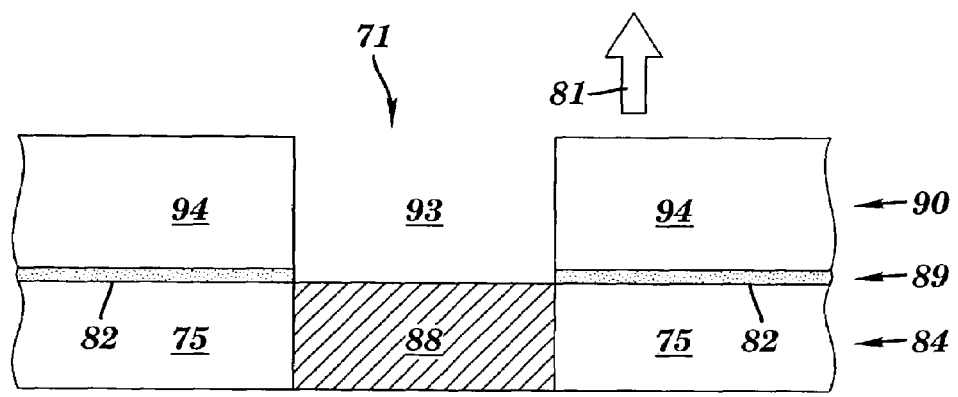
FIG. 9 depicts FIG. 8 after forming an etch stop layer on the insulating layer, forming a first inter-level dielectric (ILD) layer on the etch stop layer, and exposing a portion of the first conductive plate by forming a first trench within the first ILD layer and the etch stop layer.

FIG. 9 depicts FIG. 8 after sequentially forming an etch stop layer 89 on the insulating layer 84, and an inter-level dielectric ILD layer 90 on the etch stop layer 89. The etch stop layer 89 may include, inter alia, silicon nitride, and may be formed using any method known to one of ordinary skill in the art such as CVD. The etch stop layer 89 acts as a barrier to etching and to prevent chemical diffusion of residual ions into the insulating layer 84 from subsequent patterning or planarization steps that will be described infra in relation to FIG. 13. The etch stop layer 89 may be formed from materials such as silicon nitride or alumina. The etch stop layer 89 has a thickness (in the direction 81) between about 0.015 μm and about 0.3 μm. The etch stop layer 9 has a thickness between about 0.015 μm and about 0.3 μm. If the etch-stop functionality of the etch stop layer 89 is not needed, the etch stop layer 89 may be omitted. An ILD layer 90 is formed on the etch stop layer 89 from inter-level dielectric materials that include such materials as sputtered quartz or an oxide. A thickness of the ILD layer 90 (in the direction 81) includes between about 0.285 μm and about 4.7 μm. A first trench 93 is formed within the ILD layer 90 using the same procedure as was described supra in conjunction with FIG. 3A for forming the second trench 13.

Figure 10:
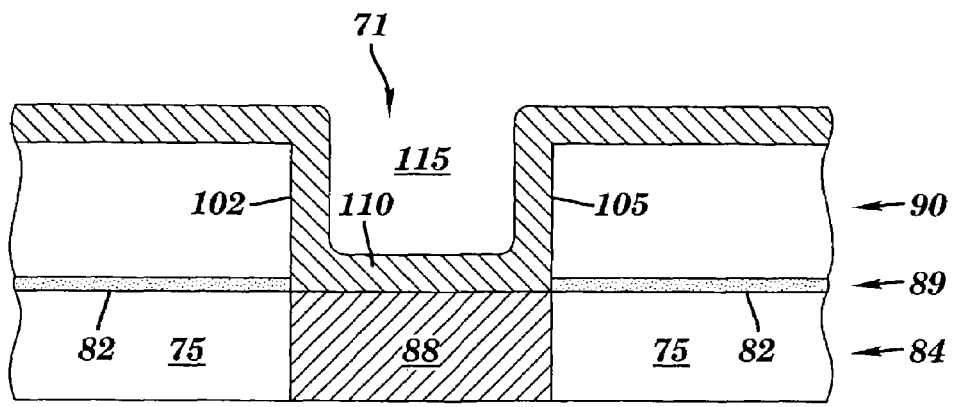
FIG. 10 depicts FIG. 9 after a first conductive layer has been conformally formed on a first and second wall of the first trench and on the portion of the first conductive plate, resulting in a second trench within the first conductive layer.

FIG. 10 depicts FIG. 9 after a first conductive layer 110 has been conformally deposited to about a uniform thickness between about 0.08 μm and about 1.3 μm on the ILD layer 90, on a first wall 102 of the first trench 93 (see FIG. 9), on the first conductive plate 88, and on a second wall 105 of the first trench 93 (see FIG. 9), resulting in a second trench 115 within the first conductive layer 110. The first conductive layer 110 has been made from any conductive materials appropriate for use as electrodes of an electrolytic cell such as described supra for forming the electrodes of battery 38 shown in FIG. 5.

FIG. 11 illustrates FIG. 10 after an electrolyte layer 121 has been conformally deposited to about a uniform thickness such as from about 0.08 μm to about 1.3 μm on a first wall 122, on a second wall 124, and on a bottom surface 125, of the second trench 115, resulting in a third trench 123 within the electrolyte layer 121. The electrolyte layer 121 may be formed using known methods, such as rf magnetron sputtering of $Li_3PO_4$ in $N_2$ as described by Bates et al. in 1994 in U.S. Pat. No. 5,338,625. The electrolyte layer 121 is made from an electrolyte material such as lithium phosphorous oxynitride (Lipon) and other like materials.

FIG. 12 depicts FIG. 11, after the third trench 123 (see FIG. 11) has been filled with a second conductive material by depositing a second conductive layer 135 on the electrolyte layer 121.

FIG. 13 depicts FIG. 12 after planarization has removed portions of: the second conductive layer 135, the electrolyte layer 121, and the first conductive layer 110. The planarization may be accomplished using any method known to one of ordinary skill in the art, such as CMP, as is described supra in conjunction with planarization of structure 1 shown in FIG. 5. The planarization leaves a conductive contact 165, as well as a remaining portion 152 of the second conductive layer 135, a remaining portion of the electrolyte layer 121, and a remaining portion of the first conductive layer 110. FIG. 13 includes a battery 39, comprising the remaining portion of the first conductive layer 110 and the remaining portion 152 of the second conductive layer 135 as electrodes (i.e., anode and cathode, or cathode and anode, respectively), and the remaining portion of the electrolyte layer 121 as the electrolyte. The conductive contact 165 is in conductive contact with the remaining portion 152 of the second conductive layer 135 (see FIG. 12). The conductive contact 165 has a height (in the direction 81) between about 0.15 μm and about 2.5 μm, and a width (in the direction 83) between about 0.04 μm and about 0.7 μm. The remaining portion 152 of the second conductive layer 135 of FIG. 13 has a height (in the direction 81) between about 0.15 μm and about 2.5 μm, and a width (in the direction 83) between about 0.1 μm and about 1.7 μm.

The battery 39 is an example of a U-Battery With Double Extension as described supra in conjunction with FIG. 20C. If the step in FIG. 10 of forming the first conductive layer 110 were modified to prevent the first conductive layer 110 from forming on either the first wall 102 or the second wall 105, then the battery 39 would be an example of a U-Battery With Single Extension as described supra in conjunction with FIG. 20C.

The electrolyte layer 121 of the battery 39 has a "U" shape and is therefore an example of a battery having a U-shaped electrolyte. Additionally, the U-shaped electrolyte layer 121 has "arms" 117 and 118 extending in the direction 81, wherein an electrode, namely the first conductive layer 110, is in contact with the arms 117 and 118. Thus, the battery 39 is considered to be a battery having a U-shaped electrolyte with electrode arm contact.

Relating the electrochemical structure 71 of FIG. 13 to the integrated circuit 400 of FIG. 1, the battery 39 is at the wiring level 900+J, and the first conductive plate 88 is at the wiring level 900+J−1. Thus, the conductive contact 165 extends conductive coupling of the battery 39 to other wiring levels which are conductively coupled to one or more electronic devices to be powered by the battery 39. For example, the conductive contact 165 is analogous to the conductor 444 of FIG. 1, described supra as being conductively coupled to the source/drain 412 of the FET 410 via the conductive metallization representation 434. Similarly, the conductive plate 88 is analogous to the conductor 442 of FIG. 1, as being conductively coupled to the gate 414 of the FET 410 via the conductive metallization representation 432.

Figure 14:
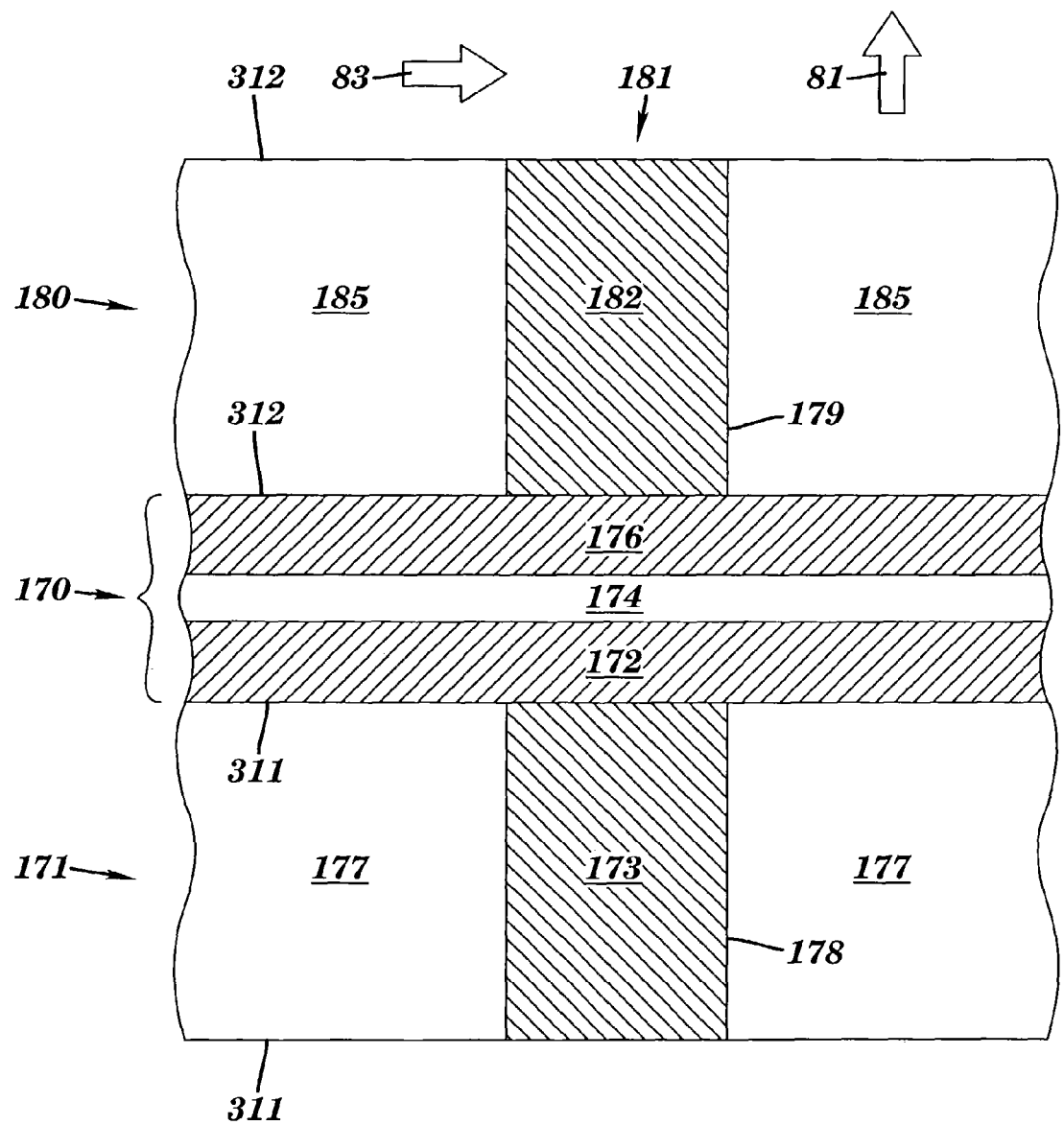
FIG. 14 depicts a front cross-sectional view of a planar battery, in accordance with embodiments of the present invention.

FIG. 14 depicts an apparatus and method for forming a battery 170 of an electrochemical structure 181 during BEOL integration, for use within or on an integrated circuit (e.g., the integrated circuit 400 described supra in conjunction with FIG. 1), in accordance with embodiments of the present invention.

The electrochemical structure 181 comprises a planar battery 170 between a first insulating layer 171 and a second insulating layer 180. The first insulating layer 171 comprises a first conductive plate 173 conductively coupled to a first conductive layer 172 which serves as a first electrode of the planar battery 170. The second insulating layer 180 comprises a second conductive plate 182 conductively coupled to a second conductive layer 176 which serves as a second electrode of the planar battery 170.

The first conductive plate 173 may be formed in the insulating layer 171 by any method known to one of ordinary skill in the art, such as in three steps as follows. In the first step, the insulating layer 171 has been deposited on a surface below such as on the layer of electronic devices 900, or on one of the wiring levels 901, ..., 900+N−1, of FIG. 1 described supra, using any method known to one of ordinary skill in the art. In the second step, a first portion of the insulating layer 171 has been removed such as by reactive ion etching (RIE), leaving a second portion 177 of the insulating layer 171, and resulting in formation of a first trench 178. In the third step, the first conductive plate 173 has been formed by filling the first trench 178 with a conductive metal. The second conductive plate 182 in the second insulating layer 180 may be formed in a manner similar to the manner in which the first conductive plate 173 has been formed, which includes forming a second trench 179. The first conductive plate 173 and the second conductive plate 182 are formed from conductive metals that may include, inter alia, Cu, W, Al, TiN, Ta, or similar metals. If the first conductive plate 173 or the second conductive plate 182 include copper, then the first conductive plate 173 or the second conductive plate 182 could be formed by damascene copper plating in the trenches 178 or the trench 179, respectively.

The planar battery 170 may be formed by sequentially depositing: the first conductive layer 172 on the first insulating layer 171; an electrolyte layer 174 on the first conductive layer 172; and the second conductive layer 176 on the electrolyte layer 174. The first conductive layer 172 and the second conductive layer 176 may be formed from appropriate materials determined by their function as an anode or cathode The electrolyte layer 174 may be formed from Lipon or equivalent material. A thickness of the first conductive layer 172 (in the direction 81) and of the second conductive layer 176 (in the direction 81) each includes from about 0.1 µm to about. 1.3 µm. A thickness of the electrolyte layer 174 (in the direction 83) includes from about 0.04 µm to about 0.7 µm.

The planar battery 170 is formed using conventional patterning and etching, such as reactive ion etching (RIE) known to one of ordinary skill in the art, to optimize desired features of the battery 170 such as its shape, so that the battery 170 will fit, either within, or on top of, the integrated circuit that includes the planar battery 170. Bates, in 1996, in U.S. Pat. No. 5,567,210 describes performance characteristics relating to surface area and output of lithium/Lipon/ $V_2O_5$ batteries. Additionally, optimizing the shape of the battery 170 enables a power output of the battery 170 to meet requirements of the application. The materials of the battery 170 (i.e., the materials of the first conductive layer 172, the electrolyte layer 174, and the second conductive layer 174) controls the voltage output of the battery (e.g., provides bias voltage or reference voltage such as from about 1 to about 5 volts).

The ILD layer 180 may be formed by depositing interlevel dielectric materials such as sputtered quartz on the second conductive layer 176. The ILD layer 180 has a thickness (in the direction 81) such as from about 0.3 µm to about 5 µm. Planarization for forming a surface 311 of first insulating layer 171 and a surface 312 of the second insulating layer 180 may be accomplished by using any method known to one of ordinary skill in the art, such as CMP described supra.

Figure 21:
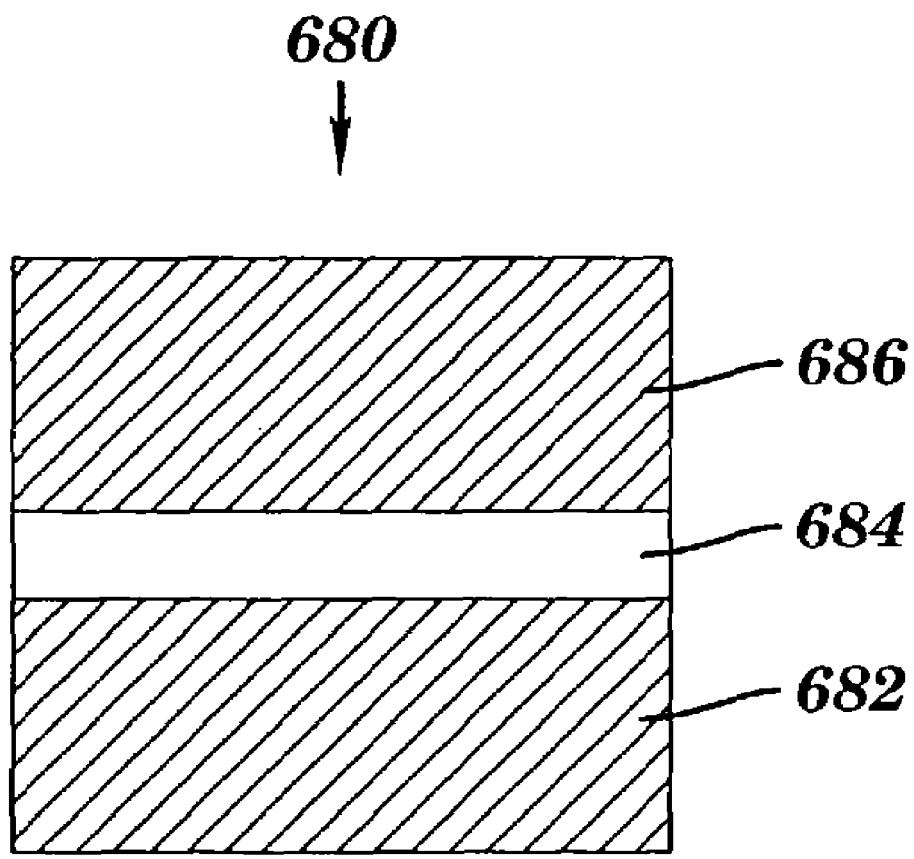
FIG. 21 depicts an S-Battery, in accordance with embodiments of the present invention.

The battery 170 is an example of a S-Battery as described supra in conjunction with FIG. 21.

Relating the electrochemical structure 181 of FIG. 14 to the integrated circuit 400 of FIG. 1, the battery 170 is at the wiring level 900+J, the first conductive plate 173 is at the wiring level 900+J−1, and the second conductive plate 182 is at the wiring level 900+J+1. Thus, the first conductive plate 173 and second conductive plate 182 extend conductive coupling of the battery 170 to other wiring levels which are conductively coupled to one or more electronic devices to be powered by the battery 170. For example, the first conductive plate 173 and the second conductive plate 182 are analogous to the conductor 442 and the conductor 444, respectively, of FIG. 1 described supra as conductively coupling to the FET 410 via the conductive metallization representation 432 and the conductive metallization representation 434, respectively, of FIG. 1.

Figure 15:
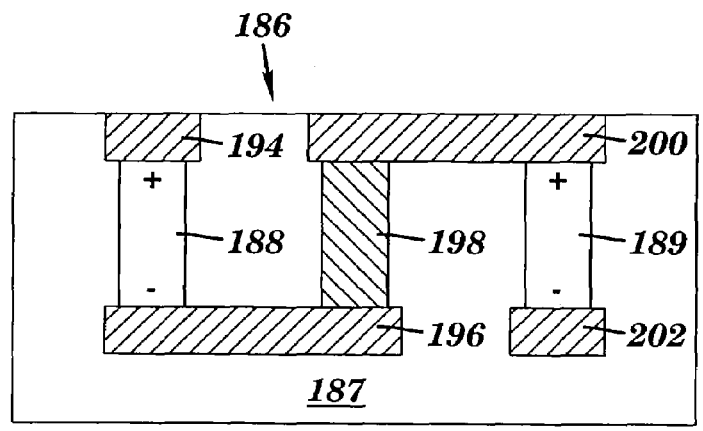
FIG. 15 depicts a front cross-sectional view of two batteries connected in series, in accordance with embodiments of the present invention.
Figure 16:
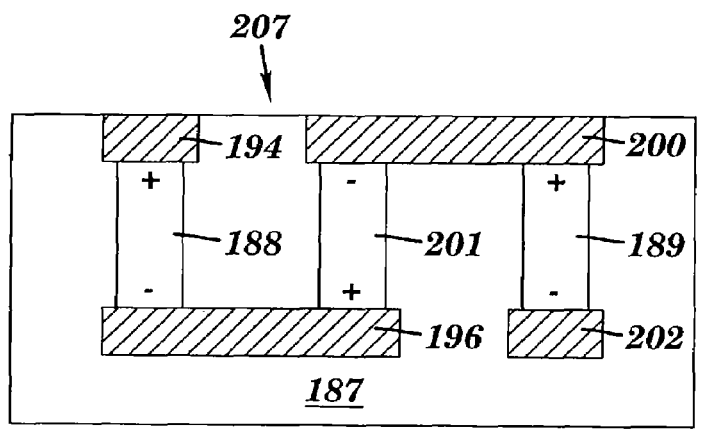
FIG. 16 depicts a front cross-sectional view of three batteries connected in series, in accordance with embodiments of the present invention.
Figure 17:
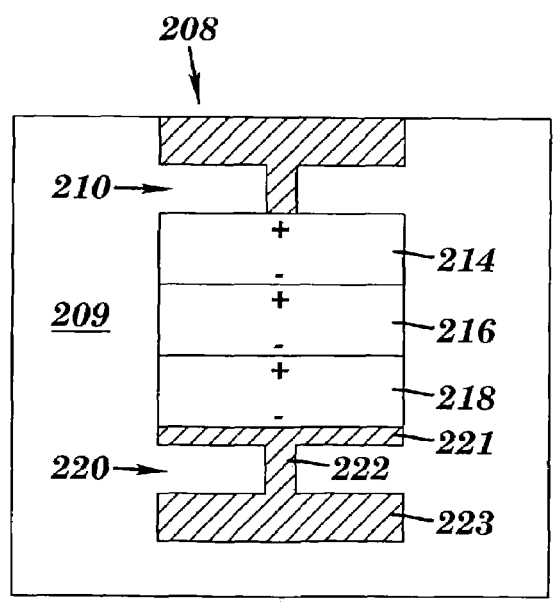
FIG. 17 depicts a front cross-sectional view of three batteries connected in series, in accordance with embodiments of the present invention.

FIGS. 15–17 depict front cross-sectional views of batteries connected in series, in accordance with embodiments of the present invention. Structures 186 in FIG. 15, 207 in FIG. 16, and 208 in FIG. 17 each illustrate a different configuration of batteries conductively coupled in series. The batteries of FIGS. 15–17 are formed during BEOL integration steps that occur during formation of integrated circuits.

FIG. 15 depicts a front cross-sectional view of an electrochemical structure 186, comprising a battery 188 and a battery 189 embedded within insulation 187 in an integrated circuit. The battery 188 and the battery 189 are connected in series such that a negative terminal of the battery 188 is conductively coupled to a positive terminal of battery 189 by conductive interconnects 196, 198, and 200, as shown. The conductive interconnects 196, 198, and 200 may be formed from conductive metals that include, inter alia, Cu, W, Al, TiN, Ta, or similar metals The batteries 188 and 189 may be formed in any manner described supra (and with any materials described supra) for forming the battery 38 associated with FIGS. 2–7, the battery 39 associated with FIGS. 8–13, or the battery 170 associated with FIG. 14. A conductive plate 194 is in conductive contact with a positive terminal of the battery 188, and a conductive plate 202 is in conductive contact with a negative terminal of the battery 189.

Relating the electrochemical structure 186 of FIG. 15 to the integrated circuit 400 of FIG. 1: the battery 188, the battery 189, and the conductive interconnect 198 are at the wiring level 900+J; the conductive plate 202 and the conductive interconnect 196 are at the wiring level 900+J−1; and the conductive plate 194 and the conductive interconnect 200 are at the wiring level 900+J+1. Thus, the conductive plate 202 and conductive plate 194 extend conductive coupling of the series-connected batteries 188 and 189 to other wiring levels which are conductively coupled to one or more electronic devices to be powered by the series-connected batteries 188 and 189. For example, the conductive plate 202 and the conductive plate 194 are analogous to the conductor 442 and the conductor 444, respectively, of FIG. 1 described supra as conductively coupling to the FET 410 via the conductive metallization representation 432 and the conductive metallization representation 434, respectively, of FIG. 1.

FIG. 15 includes three wiring levels, namely: wiring level 141, wiring level 142, and wiring level 143. While the series-connected batteries 188 and 189 are at a same wiring level, namely the wiring level 142, the series-connected batteries 188 and 189 could be rearranged to be at different wiring levels such as, inter alia, by using one or more conductive interconnects (similar to the conductive interconnect 198) to shift either the battery 188 or the battery 189 to a wiring level below (e.g., the wiring level 141) or above (e.g., the wiring level 143) the wiring level 142.

FIG. 16 depicts a front cross-sectional view of an electrochemical structure 207, which is the electrochemical structure 186 of FIG. 15 such that the conductive interconnect 198 of FIG. 15 is replaced by a battery 201 in FIG. 16. The electrochemical structure 207 comprises the battery 188, the battery 201, and the battery 189 embedded within the insulation 187 in an integrated circuit. The battery 188, the battery 201, and the battery 189 are connected in series such that the negative terminal of the battery 188 is conductively coupled to a positive terminal of battery 201 by the conductive interconnect 196, and a negative terminal of the battery 201 is conductively coupled to a positive terminal of the battery 189 by the conductive interconnect 200. The conductive interconnects 196 and 200 may be formed from conductive metals that include, inter alia, Cu, W, Al, TiN, Ta, or similar metals. The batteries 188, 201, and 189 may be formed in any manner described supra (and with any materials described supra) for forming the battery 38 associated with FIGS. 2–7, the battery 39 associated with FIGS. 8–13, or the battery 170 associated with FIG. 14. The conductive plate 194 is in conductive contact with the positive terminal of the battery 188, and the conductive plate 202 is in conductive contact with the negative terminal of the battery 189.

Relating the electrochemical structure 207 of FIG. 16 to the integrated circuit 400 of FIG. 1: the batteries 188, 201, and 189 are at the wiring level 900+J; the conductive plate 202 and the conductive interconnect 196 are at the wiring level 900+J−1; and the conductive plate 194 and the conductive interconnect 200 are at the wiring level 900+J+1. Thus, the conductive plate 202 and conductive plate 194 extend conductive coupling of the series-connected batteries 188, 201, and 189 to other wiring levels which are conductively coupled to one or more electronic devices to be powered by the series-connected batteries 188, 201, and 189. For example, the conductive plate 202 and the conductive plate 194 are analogous to the conductor 442 and the conductor 444, respectively, of FIG. 1 described supra as conductively coupling to the FET 410 via the conductive metallization representation 432 and the conductive metallization representation 434, respectively, of FIG. 1.

FIG. 16 includes three wiring levels, namely: wiring level 141, wiring level 142, and wiring level 143. While the series-connected batteries 188, 201, and 189 are at a same wiring level, namely the wiring level 142, the series-connected batteries 188, 201, and 189 could be rearranged to be at different wiring levels such as, inter alia, by using one or more conductive interconnects (similar to the conductive interconnect 198) to shift the battery 188, the battery 201, and/or the battery 189 to a wiring level below (e.g., the wiring level 141) or above (e.g., the wiring level 143) the wiring level 142. Generally, the series-connected batteries 188, 201, and 189 could: all be at the same wiring level 142 as shown in FIG. 16, each be at a different wiring level, or have two of the three aforementioned batteries at a same wiring level and the third (i.e., remaining) battery at a different wiring level.

FIG. 17 depicts a front cross-sectional view of an electrochemical structure 208 which comprises a battery 214, a battery 216, and a battery 218 embedded within an insulation 209 in an integrated circuit. The battery 214, the battery 216, and the battery 218 are directly connected (by contact) in series with no intervening conductive interconnects, as shown. The batteries 214, 216, and 218 may be formed in any manner described supra (and with any materials described supra) for forming the battery 38 associated with FIGS. 2–7, the battery 39 associated with FIGS. 8–13, or the battery 170 associated with FIG. 14. A T-shaped conductive contact 210 is in conductive contact with the positive terminal of the battery 214, and a H-shaped the conductive contact 220 is in conductive contact with the negative terminal of the battery 218.

Relating the electrochemical structure 208 of FIG. 17 to the integrated circuit 400 of FIG. 1: the batteries 214, 216, and 218 are at the wiring level 900+J; the H-shaped the conductive contact 220 is at the wiring level 900+J−1; and the T-shaped conductive contact 210 is at the wiring level 900+J+1. Thus, the H-shaped the conductive contact 220 and the T-shaped conductive contact 210 extend conductive coupling of the series-connected batteries 214, 216, and 218 to other wiring levels which are conductively coupled to one or more electronic devices to be powered by the series-connected batteries 214, 216, and 218. For example, the H-shaped conductive contact 220 and the T-shaped conductive contact 210 are analogous to the conductor 442 and the conductor 444, respectively, of FIG. 1 described supra as conductively coupling to the FET 410 via the conductive metallization representation 432 and the conductive metallization representation 434, respectively, of FIG. 1.

Components 221, 222 and 223 of the H-shaped conductive contact 220 could have been formed in different wiring levels. Alternative wiring level assignments include: components 221, 222, and 223 are assigned to a single wiring level; components 221 and 222 are assigned to a first wiring level, and component 223 is assigned to a second wiring level; components 221 is assigned to a first wiring level, components 222 is assigned to a second wiring level, and component 223 is assigned to a third wiring level; etc.

The series arrangement of the batteries 218, 216, and 214 Of FIG. 17 could be implemented by U-Batteries in series in accordance with the methodology depicted in FIGS. 8–13, discussed supra. Definitionally let the first conductive layer 110 be labeled as a first conducting layer. Noting in FIG. 13 that a first step has conformally deposited the first conducting layer (which serves as an electrode of a first polarity such as a positive polarity) on the ILD layer 90, and that a second step has conformally deposited the electrolyte layer 121 on the first conducting layer which forms a trench in the electrolyte layer 121, a third step could conformally deposit a second conducting layer (which serves as an electrode of a second polarity such as a negative polarity) within the trench defined by the electrolyte layer 121 to form a first U-Battery comprising the first conducting layer, the electrolyte layer 121, and the second conducting layer. Next and noting that each conformal depositing forms a trench within said conformal depositing as stated supra for the electrolyte layer 121, a second U-battery could be formed in series with the first U-Battery by the three steps of: conformally depositing a third conducting layer (which serves as an electrode of the first polarity) on the second conducting layer, conformally depositing a electrolyte layer on the third conducting layer, and conformally depositing a fourth conducting layer (which serves as an electrode of the second polarity) on the second electrolyte layer. Thus, the second U-battery comprises the third conducting layer, the second electrolyte layer, and the fourth conducting layer. This aforementioned process of three steps may be repeated iteratively as many times as desired. Each iterative repetition of the three steps forms a new U-battery in series with the previously formed U-Batteries. The third step, which is a conformally depositing step, associated with the last such U-Battery formed would be replaced by a step that fills the trench of the last conformally deposited electrolyte layer with conductive material in manner analogous to the forming of the second conductive layer 135 of FIG. 12 by filling the third trench 123 of FIG. 11.

While FIGS. 15, 16, and 17 depict 2 batteries, 3 batteries, and 3 batteries, respectively, in series within an integrated circuit, the present invention includes any number of batteries in series within an integrated circuit.

Figure 18:
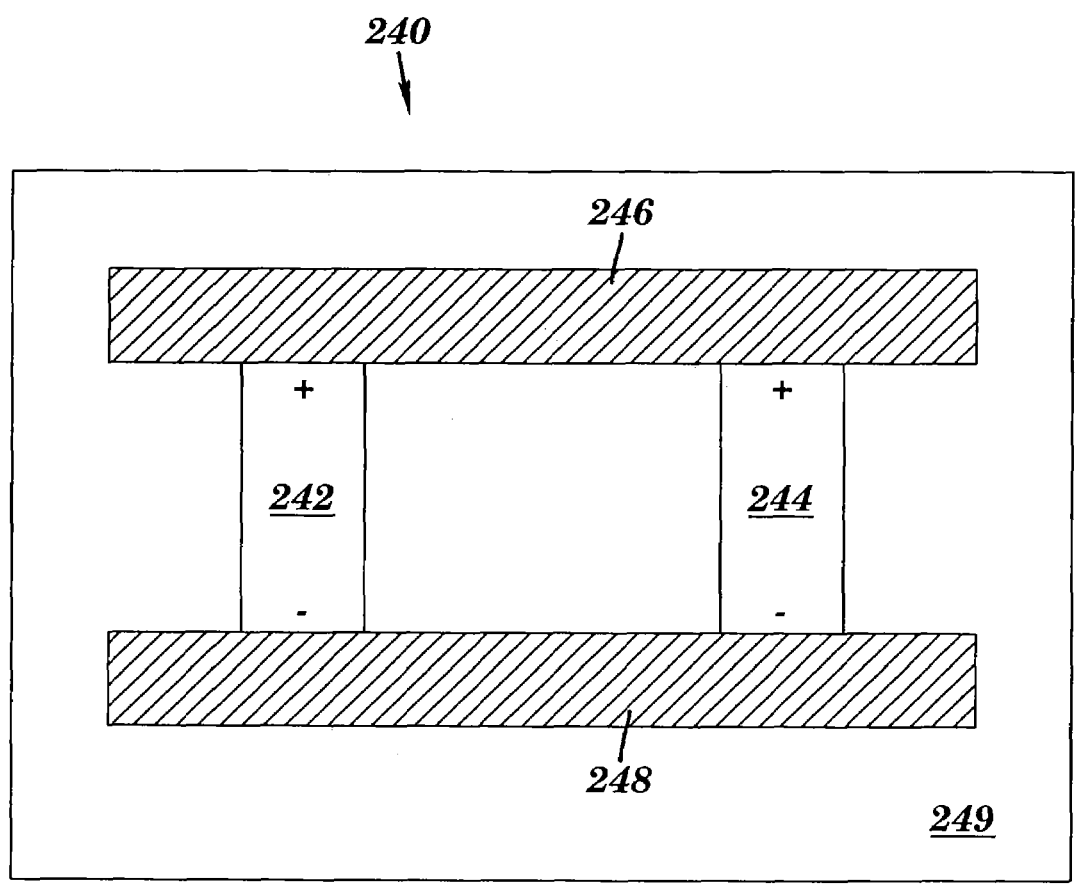
FIG. 18 depicts a front cross-sectional view of two batteries connected in parallel, in accordance with embodiments of the present invention.

FIG. 18 depicts a front cross-sectional view of the electrochemical structure 240, comprising a battery 242 and a battery 244 embedded within insulation 249 in an integrated circuit. The battery 242 and the battery 244 are connected in parallel such that negative terminals of the batteries 242 and 244 are conductively coupled to a conductive plate 248, and positive terminals of the batteries 242 and 244 are conductively coupled to a conductive plate 246, as shown.

Relating the electrochemical structure 240 of FIG. 18 to the integrated circuit 400 of FIG. 1: the battery 242 and the battery 244 are at the wiring level 900+J; the conductive plate 248 is at the wiring level 900+J−1; and the conductive plate 246 is at the wiring level 900+J+1. Thus, the conductive plate 248 and the conductive plate 246 extend conductive coupling of the parallel-connected batteries 242 and 244 to other wiring levels which are conductively coupled to one or more electronic devices to be powered by the parallel-connected batteries 242 and 244. For example, the conductive plate 248 and the conductive plate 246 are analogous to the conductor 442 and the conductor 444, respectively, of FIG. 1 described supra as conductively coupling to the FET 410 via the conductive metallization representation 432 and the conductive metallization representation 434, respectively, of FIG. 1.

The electrochemical structure 240 of FIG. 18 of batteries connected in parallel could be placed in a single wiring level such as the wiring level 900+J of FIG. 19.

While FIG. 18 depicts 2 batteries in parallel within an integrated circuit, the present invention includes any number of batteries in parallel within an integrated circuit.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming an electrochemical structure within an integrated circuit, comprising the steps of:
    providing a semiconductor wafer;
    forming a layer of electronic devices on the semiconductor wafer, wherein the layer of electronic devices includes at least one electronic device;
    forming N wiring levels within an interconnect structure of the integrated circuit, wherein the N wiring levels are disposed on the layer of electronic devices, wherein N is at least 2, wherein the N wiring levels are denoted as wiring level 1, wiring level 2, ..., wiring level N in order of increasing distance from the semiconductor wafer;
    forming a first conductive metallization and a second conductive metallization within the N wiring levels; and
    forming at least one battery entirely within the wiring levels I through K, wherein I is selected from the group consisting of 1, 2, ..., and N−1, wherein K is selected from the group consisting of 1, 2, ..., and N−1, wherein I does not exceed K, wherein the first conductive metallization conductively couples a first electrode of the at least one battery to the at least one electronic device, and wherein the second conductive metallization conductively couples a second electrode of the battery to the at least one electronic device, and wherein the first and second conductive metallizations are totally external to the interior of the at least one battery.

2. The method of claim 1, wherein forming at least one battery includes forming a first battery, comprising:
    forming an exposed insulating layer in the wiring level I and an exposed first conductive layer in the insulating layer;
    forming an inter-level dielectric (ILD) layer over the exposed first conductive layer and over the exposed insulating layer;
    forming a first trench within the ILD layer by removing a portion of the ILD layer, which exposes a portion of the first conductive layer;
    conformally depositing an electrolyte layer over the ILD layer, over sidewalls of the first trench, and within the first trench over the first conductive layer, wherein a second trench is formed and is bounded by tho electrolyte layer;
    depositing a second conductive material in the second trench and on the electrolyte layer, wherein the second conductive material overfills the second trench; and
    polishing off top portions of the electrolyte layer and the second conductive material resulting in a planarized top surface of the electrolyte layer and the second conductive material, wherein a U-battery has been formed from the first conductive layer as the first electrode, the electrolyte layer as an electrolyte, and the second conductive material as the second electrode.

3. The method of claim 2, wherein the first electrode is selected from the group consisting of an anode and a cathode;
    wherein if the first electrode is an anode, then the second electrode is a cathode, the first conductive layer includes an anode material, and the second conductive material includes a cathode material; and
    wherein if the first electrode is a cathode, then the second electrode is an anode, the first conductive layer includes a cathode material, and the second conductive material includes an anode material.

4. The method of claim 3, wherein the anode material is selected from the group consisting of lithium, lithiated vanadium oxide ($Li_8V_2O_5$), AgI, Ag, and Zn, and wherein the cathode material is selected from the group consisting of $V_2O_5$, $LiMn_2O_4$, $LiCoO_2$, Sn, Pb, and Ag, and wherein an electrolyte of the first battery includes lithium phosphorous oxynitride.

5. The method of claim 2, wherein forming an ILD layer over the exposed first conductive layer and over the exposed insulating layer comprises: forming an etch stop layer on the exposed first conductive layer and on the exposed insulating layer, and forming the ILD layer on the etch stop layer; and
  wherein forming a first trench within the first ILD layer further comprises removing a portion of the etch stop layer to expose the portion of the first conductive layer.

6. The method of claim 2, further comprising after forming a first trench: conformally depositing a conductive diffusion barrier film on the ILD layer, on sidewalls of the first trench, and on the exposed portion of the first conductive layer, and wherein the step of conformally depositing an electrolyte layer comprises depositing the electrolyte layer on the diffusion barrier.

7. The method of claim 2, further comprising after forming a first trench: conformally depositing a diffusion barrier film on the ILD layer, on sidewalls of the first trench, and on the exposed portion of the first conductive layer; and removing the diffusion barrier film that exists on the exposed portion of the first conductive layer, wherein the step of conformally depositing an electrolyte layer comprises depositing the electrolyte layer on the diffusion barrier film and within the first trench over the first conductive layer.

8. The method of claim 2, wherein forming a first conductive metallization and a second conductive metallization comprises:
  forming a composite ILD layer on the planarized top surface; and
  forming a composite trench within the composite ILD layer, which exposes a portion of the second conductive material; and
  overfilling the composite trench with a third conductive material, wherein the third conductive material conductively contacts the second conductive material; and
  polishing off a top portion of the third conductive material, which forms a planarized top surface of the third conductive material and which forms a conductive contact made of the third conductive material, wherein the first conductive metallization or the second conductive metallization includes the conductive contact.

9. The method of claim 1, wherein forming at least one battery includes forming a first battery, wherein forming a first battery, forming a first conductive metallization, and forming a second conductive metallization comprises:
  forming an exposed insulating layer in the wiring level I and an exposed conductive plate in the insulating layer;
  forming an inter-level dielectric (ILD) layer over the exposed conductive plate and over the exposed insulating layer;
  forming a first trench within the ILD layer by removing a portion of the ILD layer, which exposes a portion of the first conductive plate;
  conformally depositing a first conductive layer on the ILD layer, on sidewalls of the first trench, and on the exposed portion of the first conductive plate, wherein a second trench is formed and is bounded by the first conductive layer;
  conformally depositing an electrolyte layer on the first conductive layer, wherein a third trench is formed and is bounded by the electrolyte layer;
  depositing a second conductive material in the third trench and on the electrolyte layer, wherein the second conductive material overfills the third trench; and
  polishing off top portions of the second conductive material, of the electrolyte layer, and of the first conductive layer, which results in a planarized top surface of the ILD layer, of the first conductive layer, of the electrolyte layer, and of the second conductive material, wherein a conductive contact is formed on the planarized top surface, wherein the conductive contact is in conductive contact with the second conductive material, wherein the first conductive metallization includes the conductive plate, and wherein the second conductive metallization includes the conductive contact, and wherein a U-battery With Double Extension has been formed from the first conductive layer as the first electrode, the electrolyte layer as an electrolyte, and the second conductive material as the second electrode.

10. The method of claim 9, wherein the first electrode is selected from the group consisting of an anode and a cathode;
  wherein if the first electrode is an anode, then the second electrode is a cathode, the first conductive layer includes an anode material, and the second conductive material includes a cathode material; and
  wherein if the first electrode is a cathode, then the second electrode is an anode, the first conductive layer includes a cathode material, and the second conductive material includes an anode material.

11. The method of claim 10, wherein the anode material is selected from the group consisting of lithium and lithiated vanadium oxide ($Li_8V_2O_5$), wherein the cathode material includes $V_2O_5$, and wherein the electrolyte layer includes lithium phosphorous oxynitride.

12. The method of claim 9, wherein forming an exposed insulating layer in the wiring level I and an exposed conductive plate in the dielectric layer comprises: forming an etch stop layer on the exposed first conductive plate and on the exposed insulating layer, and forming the ILD layer on the etch stop layer; and
  wherein forming a first trench within the ILD layer further comprises removing a portion of the etch stop layer to expose the portion of the first conductive plate.

13. The method of claim 1, wherein forming at least one battery includes forming a first battery, wherein forming a first battery, forming a first conductive metallization, and forming a second conductive metallization comprises:
  forming an exposed insulating layer in the wiring level I and an exposed first conductive plate in the dielectric;
  forming a first conductive layer on the insulating layer such that the first conductive layer is in conductive contact with the first conductive plate;
  forming an electrolyte layer on the first conductive layer, wherein the electrolyte layer includes electrolyte materials; and
  forming a second conductive layer on the electrolyte layer, wherein the second conductive layer includes a second conductive material, wherein the first conductive metallization includes the first conductive plate, and wherein a S-battery has been formed from the first conductive layer as the first electrode, the electrolyte layer as an electrolyte, and the second conductive layer as the second electrode.

14. The method of claim 13, wherein the first electrode is selected from the group consisting of an anode and a cathode;
  wherein if the first electrode is an anode, then the second electrode is a cathode, the first conductive layer includes an anode material, and the second conductive layer includes a cathode material; and
  wherein if the first electrode is a cathode, then the second electrode is an anode, the first conductive layer includes a cathode material, and the second conductive layer includes an anode material.

15. The method of claim 14, wherein the anode material is selected from the group consisting of lithium and lithiated vanadium oxide ($Li_8V_2O_5$), AgI, Ag and Zn, and wherein the cathode material is selected from the group consisting of $V_2O_5$, $LiMn_2O_4$, $LiCoO_2$, Sn, Pb and Ag, and wherein an electrolyte of the first battery includes lithium phosphorous oxynitride.

16. The method of claim 13, further comprising:
forming an inter-level dielectric (ILD) layer on the second conductive layer;
forming a trench within the ILD layer by removing a portion of the ILD layer, which exposes a portion of the second conductive layer;
overfilling the trench with a third conductive material; and
polishing off top portions of the third conductive material, which results in a planarized top surface of the ILD layer and of the third conductive material, wherein a second conductive plate is formed from the third conductive material on the planarized top surface, wherein the second conductive plate is in conductive contact with the second conductive layer, and wherein the second conductive metallization includes the second conductive plate.

17. The method of claim 1, wherein forming the at least one battery includes forming a plurality of batteries in series.

18. The method of claim 17, wherein the batteries in series consist of U-Batteries in series.

19. The method of claim 17, wherein the plurality of batteries includes M batteries denoted as batteries 1, 2, . . . , M, wherein M is at least 2, wherein each battery L is in series with battery L+1 and is conductively coupled to battery L+1 by a conductive interconnect, and wherein L=1, 2, . . . , M−1.

20. The method of claim 17, wherein the plurality of batteries includes M batteries denoted as batteries 1, 2, . . . , M, wherein M is at least 2, wherein each battery L is in series with battery L+1 and is conductively coupled to battery L+1, wherein there is no conductive interconnect between battery L and battery L+1, and wherein L=1, 2, . . . , M−1.

21. The method of claim 1, wherein forming the at least one battery includes forming a plurality of batteries in parallel.

22. The method of claim 1, wherein forming a first conductive metallization includes forming a first conductive contact that conductively contacts the first electrode, wherein forming a second conductive metallization includes forming a second conductive contact that conductively contacts the second electrode, wherein the first conductive contact is within the wiring levels I, I+1, . . . K, and wherein the second conductive contact is within the wiring levels I, I+1, . . . K.

23. The method of claim 22, wherein K=I.

24. The method of claim 1, wherein forming a first conductive metallization includes forming a first conductive contact that conductively contacts the first electrode, wherein forming a second conductive metallization includes forming a second conductive contact that conductively contacts the second electrode, wherein the first conductive contact is outside of the wiring levels I, I+1, . . . K, and wherein the second conductive contact is outside of the wiring levels I, I+1, . . . K.

25. The method of claim 1, wherein forming the at least one battery includes forming a first battery, wherein an anode of the first battery includes an anode material selected from the group consisting of lithium, lithiated vanadium oxide ($Li_8V_2O_5$), AgI, Ag, and Zn, and wherein a cathode of the first battery includes a cathode material selected from the group consisting of $V_2O_5$, $LiMn_2O_4$, $LiCoO_2$, Sn, Pb, and Ag, and wherein an electrolyte of the first battery includes lithium phosphorous oxynitride.

26. The method of claim 1, wherein forming the at least one battery includes forming a U-Battery.

27. The method of claim 26, wherein the U-Battery is a U-Battery With Double Extension.

28. The method of claim 1, wherein forming the at least one battery includes forming a S-Battery.

29. The method of claim 1, wherein the step of forming a layer of electronic devices includes forming the layer of electronic devices during a Front-End-Of-Line (FEOL) processing of the integrated circuit, wherein the step of forming N wiring levels includes forming the N wiring levels during a Back-End-Of-Line (BEOL) integration of the integrated circuit, wherein the step of forming a first conductive metallization and a second conductive metallization includes forming the first conductive metallization and the second conductive metallization during the BEOL integration of the integrated circuit, and wherein the step of forming at least one battery includes forming the at least one battery during the BEOL integration of the integrated circuit.

30. The method of claim 1, wherein a portion of the first conductive metallization or a portion of the second conductive metallization is within wiring level J such that J>K.

31. The method of claim 1, wherein a first electrically conductive path from the first electrode to the at least one electronic device comprises the first conductive metallization arid is entirely within the N wiring levels, and wherein a second electrically conductive path from the second electrode to the at least one electronic device comprises the second conductive metallization and is entirely within the N wiring levels.

32. The method of claim 1, wherein K=I.

33. The method of claim 1, wherein N is at least 3, and wherein K is selected from the group consisting of I, 2+1, . . . , and N−2.

* * * * *

UNITED STATES PATENT AND TRADEMARK OFFICE
CERTIFICATE OF CORRECTION

| | | |
|---|---|---|
| PATENT NO. | : 7,045,372 B2 | Page 1 of 2 |
| APPLICATION NO. | : 10/632652 | |
| DATED | : May 16, 2006 | |
| INVENTOR(S) | : Ballantine et al. | |

It is certified that error appears in the above-identified patent and that said Letters Patent is hereby corrected as shown below:

Column 4
Lines 45 and 63, delete "$\underline{\leq}$" and insert -- $\leq$ --
Line 63, delete "$\underline{\geq}$", and insert -- $\geq$ --

Column 5
Line 22, delete "900+1" and insert -- 900+I --
Line 57, delete "$\underline{\leq}$" and insert -- $\leq$ --
Line 62, delete "900+1" and insert -- 900+I --

Column 6
Line 4, insert a comma after "J'

Column 7
After Line 30, insert this paragraph:
-- FIG. 21 illustrates a S-Battery 680, in accordance with embodiments of the present invention. The S-Battery 680 includes an electrolyte 684 sandwiched between electrodes 682 and 686. A characteristic feature of a S-Battery is a stratified (i.e. layered) structure of the electrolyte sandwiched between electrodes.--

Column 10
Line 62, delete "oml" and insert --ornl--

Column 16
Line 45, delete "metals The" and insert -- metals. The --

Column 20
Line 34, delete "tho" and insert -- the --

UNITED STATES PATENT AND TRADEMARK OFFICE
CERTIFICATE OF CORRECTION

PATENT NO. : 7,045,372 B2
APPLICATION NO. : 10/632652
DATED : May 16, 2006
INVENTOR(S) : Ballantine et al.

It is certified that error appears in the above-identified patent and that said Letters Patent is hereby corrected as shown below:

Column 24
Line 43, delete "arid" and insert -- and --
Line 50 and 51, delete "wherein K is selected from the group consisting of I, 2+1,..., and N-2." and insert -- wherein I is selected from the group consisting of 1,2,..., and N-2. --

Signed and Sealed this

Twenty-second Day of August, 2006

JON W. DUDAS
*Director of the United States Patent and Trademark Office*